(12) United States Patent
Morgan et al.

(10) Patent No.: US 6,936,978 B2
(45) Date of Patent: Aug. 30, 2005

(54) METHODS AND APPARATUS FOR REMOTELY CONTROLLED ILLUMINATION OF LIQUIDS

(75) Inventors: Frederick M. Morgan, Quincy, MA (US); Ihor A. Lys, Milton, MA (US); George G. Mueller, Boston, MA (US); Kevin J. Dowling, Westford, MA (US); Timothy Holmes, Jacksonville, FL (US); John Warwick, Cambridge, MA (US)

(73) Assignee: Color Kinetics Incorporated, Boston, MA (US)

( * ) Notice: Subject to any disclaimer, the term of this patent is extended or adjusted under 35 U.S.C. 154(b) by 160 days.

(21) Appl. No.: 10/040,291

(22) Filed: Oct. 25, 2001

(65) Prior Publication Data

US 2002/0153851 A1 Oct. 24, 2002

Related U.S. Application Data

(63) Continuation-in-part of application No. 09/870,418, filed on May 31, 2001, and a continuation-in-part of application No. 09/870,193, filed on May 30, 2001, now Pat. No. 6,608,453, and a continuation-in-part of application No. 09/815,418, filed on Mar. 22, 2001, and a continuation-in-part of application No. 09/805,368, filed on Mar. 13, 2001, and a continuation-in-part of application No. 09/805,590, filed on Mar. 13, 2001, and a continuation-in-part of application No. 09/742,017, filed on Dec. 20, 2000, now abandoned, and a continuation-in-part of application No. 09/669,121, filed on Sep. 25, 2000, now Pat. No. 6,806,659, and a continuation-in-part of application No. 09/616,214, filed on Jul. 14, 2000, which is a continuation of application No. 09/425,770, filed on Oct. 22, 1999, now Pat. No. 6,150,774, and a continuation-in-part of application No. 09/344,699, filed on Jun. 25, 1999, and a continuation-in-part of application No. 09/333,739, filed on Jun. 15, 1999, and a continuation-in-part of application No. 09/215,624, filed on Dec. 17, 1998, now Pat. No. 6,528,954, and a continuation-in-part of application No. 09/213,581, filed on Dec. 17, 1998, and a continuation-in-part of application No. 09/213,540, filed on Dec. 17, 1998, now Pat. No. 6,720,745, application No. 09/213,548, filed on Dec. 12, 1998, now Pat. No. 6,166,496, which is a continuation-in-part of application No. 08/920,156, filed on Aug. 26, 1997, now Pat. No. 6,016,038

(60) Provisional application No. 60/297,828, filed on Jun. 13, 2001, provisional application No. 60/296,377, filed on Jun. 6, 2001, provisional application No. 60/290,101, filed on May 10, 2001, provisional application No. 60/243,250, filed on Oct. 25, 2000, provisional application No. 60/090,920, filed on Jun. 26, 1998, provisional application No. 60/079,285, filed on Mar. 25, 1998, provisional application No. 60/078,861, filed on Mar. 20, 1998, provisional application No. 60/068,792, filed on Dec. 24, 1997, and provisional application No. 60/071,281, filed on Dec. 17, 1997.

(51) Int. Cl.$^7$ .................. H05B 37/02; G01R 15/08
(52) U.S. Cl. .............. 315/291; 315/299; 324/115; 324/99 D; 324/96; 324/131; 345/83; 345/150
(58) Field of Search ..................... 315/291, 292, 315/299; 324/115, 96, 131; 84/464 R; 345/83, 150, 88, 589; 362/85, 227, 250, 231, 223, 293

(56) References Cited

U.S. PATENT DOCUMENTS

| 2,909,097 A | | 10/1959 | Alden et al. |
|---|---|---|---|
| 3,192,379 A | * | 6/1965 | De Garmo .................. 362/267 |
| 3,318,185 A | | 5/1967 | Kott |
| 3,561,719 A | | 2/1971 | Grindle |
| 3,586,936 A | | 6/1971 | McLeroy |
| 3,601,621 A | | 8/1971 | Ritchie |
| 3,643,088 A | | 2/1972 | Osteen et al. |
| 3,746,918 A | | 7/1973 | Drucker et al. |
| 3,818,216 A | | 6/1974 | Larraburu |
| 3,832,503 A | | 8/1974 | Crane |
| 3,858,086 A | | 12/1974 | Anderson et al. |
| 3,909,670 A | | 9/1975 | Wakamatsu et al. |
| 3,924,120 A | | 12/1975 | Cox, III |
| 3,958,885 A | | 5/1976 | Stockinger et al. |
| 3,974,637 A | | 8/1976 | Bergey et al. |
| 4,001,571 A | | 1/1977 | Martin |
| 4,054,814 A | | 10/1977 | Fegley et al. |
| 4,082,395 A | | 4/1978 | Donato et al. |
| 4,096,349 A | | 6/1978 | Donato |
| 4,241,295 A | | 12/1980 | Williams, Jr. |
| 4,272,689 A | | 6/1981 | Crosby et al. |
| 4,273,999 A | | 6/1981 | Pierpoint |
| 4,298,869 A | | 11/1981 | Okuno |

| Patent | Date | Inventor |
|---|---|---|
| 4,305,117 A | 12/1981 | Evans |
| 4,329,625 A | 5/1982 | Nishizawa et al. |
| 4,367,464 A | 1/1983 | Kurahashi et al. |
| 4,388,567 A | 6/1983 | Yamazaki et al. |
| 4,388,589 A | 6/1983 | Molldrem, Jr. |
| 4,392,187 A | 7/1983 | Bornhorst |
| 4,394,716 A | 7/1983 | Campagna et al. |
| 4,420,711 A | 12/1983 | Takahashi et al. |
| 4,500,796 A | 2/1985 | Quin |
| 4,622,881 A | 11/1986 | Rand |
| 4,625,152 A | 11/1986 | Nakai |
| 4,635,052 A | 1/1987 | Aoike et al. |
| 4,647,217 A | 3/1987 | Havel |
| 4,656,398 A | 4/1987 | Michael et al. |
| 4,668,895 A | 5/1987 | Schneiter |
| 4,682,079 A | 7/1987 | Sanders et al. |
| 4,686,425 A | 8/1987 | Havel |
| 4,687,340 A | 8/1987 | Havel |
| 4,688,154 A | 8/1987 | Nilssen |
| 4,688,869 A | 8/1987 | Kelly |
| 4,695,769 A | 9/1987 | Schweickardt |
| 4,701,669 A | 10/1987 | Head et al. |
| 4,704,660 A | 11/1987 | Robbins |
| 4,705,406 A | 11/1987 | Havel |
| 4,707,141 A | 11/1987 | Havel |
| 4,727,289 A | 2/1988 | Uchida |
| 4,740,882 A | 4/1988 | Miller |
| 4,753,148 A | 6/1988 | Johnson |
| 4,771,274 A | 9/1988 | Havel |
| 4,780,621 A | 10/1988 | Bartleucci et al. |
| 4,780,917 A | 11/1988 | Hancock |
| 4,818,072 A | 4/1989 | Mohebban |
| 4,837,565 A | 6/1989 | White |
| 4,843,627 A | 6/1989 | Stebbins |
| 4,844,333 A | 7/1989 | Davis et al. |
| 4,845,481 A | 7/1989 | Havel |
| 4,845,745 A | 7/1989 | Havel |
| 4,863,223 A | 9/1989 | Weissenbach et al. |
| 4,874,320 A | 10/1989 | Freed et al. |
| 4,887,074 A | 12/1989 | Simon et al. |
| 4,922,154 A | 5/1990 | Cacoub |
| 4,934,852 A | 6/1990 | Havel |
| 4,962,687 A * | 10/1990 | Belliveau et al. ......... 84/464 R |
| 4,973,835 A | 11/1990 | Kurosu et al. |
| 4,979,081 A | 12/1990 | Leach et al. |
| 4,980,806 A | 12/1990 | Taylor et al. |
| 4,992,704 A | 2/1991 | Stinson |
| 5,003,227 A | 3/1991 | Nilssen |
| 5,008,595 A | 4/1991 | Kazar |
| 5,010,459 A | 4/1991 | Taylor et al. |
| 5,012,457 A | 4/1991 | Mitchell et al. |
| 5,027,262 A | 6/1991 | Freed |
| 5,034,807 A | 7/1991 | Von Kohorn |
| 5,072,216 A | 12/1991 | Grange |
| 5,078,039 A | 1/1992 | Tulk et al. |
| 5,083,063 A | 1/1992 | Brooks |
| 5,117,233 A | 5/1992 | Hamos et al. |
| 5,126,634 A | 6/1992 | Johnson |
| 5,128,595 A | 7/1992 | Hara |
| 5,134,387 A | 7/1992 | Smith et al. |
| 5,142,199 A | 8/1992 | Elwell |
| 5,154,641 A | 10/1992 | McLaughlin |
| 5,164,715 A | 11/1992 | Kashiwabara et al. |
| 5,169,236 A | 12/1992 | Iest |
| 5,184,114 A | 2/1993 | Brown |
| 5,194,854 A | 3/1993 | Havel |
| 5,209,560 A | 5/1993 | Taylor et al. |
| 5,225,765 A | 7/1993 | Callahan et al. |
| 5,226,723 A | 7/1993 | Chen |
| 5,254,910 A | 10/1993 | Yang |
| 5,256,948 A | 10/1993 | Boldin et al. |
| 5,282,121 A | 1/1994 | Bornhorst et al. |
| 5,294,865 A | 3/1994 | Haraden |
| 5,301,090 A | 4/1994 | Hed |
| 5,307,295 A | 4/1994 | Taylor et al. |
| 5,329,431 A | 7/1994 | Taylor et al. |
| 5,350,977 A | 9/1994 | Hamamoto et al. |
| 5,357,170 A | 10/1994 | Luchaco et al. |
| 5,371,618 A | 12/1994 | Tai et al. |
| 5,374,876 A | 12/1994 | Horibata et al. |
| 5,388,357 A | 2/1995 | Malita |
| 5,402,702 A | 4/1995 | Hata |
| 5,404,282 A | 4/1995 | Klinke et al. |
| 5,406,176 A | 4/1995 | Sugden |
| 5,410,328 A | 4/1995 | Yoksza et al. |
| 5,412,284 A | 5/1995 | Moore et al. |
| 5,412,552 A | 5/1995 | Fernandes |
| 5,420,482 A | 5/1995 | Phares |
| 5,421,059 A | 6/1995 | Leffers, Jr. |
| 5,432,408 A | 7/1995 | Matsuda et al. |
| 5,436,535 A | 7/1995 | Yang |
| 5,461,188 A | 10/1995 | Drago et al. |
| 5,463,280 A | 10/1995 | Johnson |
| 5,465,144 A | 11/1995 | Parker et al. |
| 5,489,827 A | 2/1996 | Xia |
| 5,491,402 A | 2/1996 | Small |
| 5,504,395 A | 4/1996 | Johnson et al. |
| 5,530,322 A | 6/1996 | Ference et al. |
| 5,545,950 A | 8/1996 | Cho |
| 5,561,346 A | 10/1996 | Byrne |
| 5,569,371 A | 10/1996 | Perling |
| 5,575,459 A | 11/1996 | Anderson |
| 5,575,554 A | 11/1996 | Guritz |
| 5,592,051 A | 1/1997 | Korkala |
| 5,636,303 A | 6/1997 | Che et al. |
| 5,640,061 A | 6/1997 | Bornhorst et al. |
| 5,642,129 A | 6/1997 | Zavracky et al. |
| 5,673,059 A | 9/1997 | Zavracky et al. |
| 5,680,730 A | 10/1997 | Epple |
| 5,701,058 A | 12/1997 | Roth |
| 5,721,471 A | 2/1998 | Begemann et al. |
| 5,725,761 A | 3/1998 | Phillips |
| 5,734,590 A | 3/1998 | Tebbe |
| 5,751,118 A | 5/1998 | Mortimer |
| 5,769,527 A * | 6/1998 | Taylor et al. ................. 362/85 |
| 5,799,124 A | 8/1998 | Zorn et al. |
| 5,803,579 A | 9/1998 | Turnbull et al. |
| 5,808,689 A | 9/1998 | Small |
| 5,821,695 A | 10/1998 | Vilanilam et al. |
| 5,848,837 A | 12/1998 | Gustafson |
| 5,850,126 A | 12/1998 | Kanbar |
| 5,851,063 A | 12/1998 | Doughty et al. |
| 5,852,658 A | 12/1998 | Knight et al. |
| RE36,030 E | 1/1999 | Nadeau |
| 5,859,508 A | 1/1999 | Ge et al. |
| 5,896,010 A | 4/1999 | Mikolajczak et al. |
| 5,912,653 A | 6/1999 | Fitch |
| 5,924,784 A | 7/1999 | Chliwnyj et al. |
| 5,927,845 A | 7/1999 | Gustafson et al. |
| 5,946,209 A | 8/1999 | Eckel et al. |
| 5,952,680 A | 9/1999 | Strite |
| 5,959,547 A | 9/1999 | Tubel et al. |
| 5,963,185 A | 10/1999 | Havel |
| 5,974,553 A | 10/1999 | Gandar |
| 6,002,216 A | 12/1999 | Mateescu |
| 6,008,783 A | 12/1999 | Kitagawa et al. |
| 6,016,038 A | 1/2000 | Mueller et al. |
| 6,018,237 A | 1/2000 | Havel |
| 6,025,550 A | 2/2000 | Kato |
| 6,030,108 A | 2/2000 | Ishiharada et al. |
| 6,031,343 A | 2/2000 | Recknagel et al. |
| 6,068,383 A | 5/2000 | Robertson et al. |

| | | | |
|---|---|---|---|
| 6,072,280 A | 6/2000 | Allen | |
| 6,095,661 A | 8/2000 | Lebens et al. | |
| 6,097,352 A | 8/2000 | Zavracky et al. | |
| 6,132,072 A | 10/2000 | Turnbull et al. | |
| 6,133,722 A | * 10/2000 | Havel | 324/115 |
| 6,150,774 A | 11/2000 | Mueller et al. | |
| 6,166,496 A | 12/2000 | Lys et al. | |
| 6,183,086 B1 | 2/2001 | Neubert | |
| 6,196,471 B1 | 3/2001 | Ruthenberg | |
| 6,211,626 B1 | 4/2001 | Lys et al. | |
| 6,215,409 B1 | 4/2001 | Blach | |
| 6,250,774 B1 | 6/2001 | Begemann et al. | |
| 6,252,358 B1 | 6/2001 | Xydis et al. | |
| 6,292,901 B1 | 9/2001 | Lys et al. | |
| 6,340,868 B1 | 1/2002 | Lys et al. | |
| 6,379,025 B1 | 4/2002 | Mateescu et al. | |
| 6,459,919 B1 | 10/2002 | Lys et al. | |
| 6,811,286 B2 | 11/2004 | Mateescu et al. | |
| 2001/0033488 A1 | 10/2001 | Chliwnj et al. | |

FOREIGN PATENT DOCUMENTS

| | | |
|---|---|---|
| AU | 6 267 9 | 12/1996 |
| CA | 2 178 432 | 12/1996 |
| EP | 0495305 A2 | 7/1992 |
| EP | 0534710 B1 | 1/1996 |
| EP | 0752632 A2 | 1/1997 |
| EP | 0752632 A3 | 8/1997 |
| EP | 0823812 A2 | 2/1998 |
| EP | 0935234 A1 | 8/1999 |
| EP | 0942631 A2 | 9/1999 |
| EP | 1020352 A2 | 7/2000 |
| EP | 1113215 A2 | 7/2001 |
| FR | 88 17359 | 12/1998 |
| GB | 2045098 A | 10/1980 |
| GB | 2135536 A | 8/1984 |
| GB | 2176042 A | 12/1986 |
| JP | 06043830 | 2/1994 |
| JP | 7-39120 | 7/1995 |
| JP | 8-106264 | 4/1996 |
| JP | 9 320766 | 12/1997 |
| WO | WO 89/05086 | 6/1989 |
| WO | WO 94/18809 | 8/1994 |
| WO | WO 95/13498 | 5/1995 |
| WO | WO 96/41098 | 12/1996 |

OTHER PUBLICATIONS

* "LM117/LM317A/LM317 3–Terminal Adjustable Regulator", National Semiconductor Corporation, May 1997, pp. 1–20.

* "DS96177 RS–485 / RS–422 Differential Bus Repeater", National Semiconductor Corporation, Feb. 1996, pp. 1–8.

* "DS2003 / DA9667 / DS2004 High Current / Voltage Darlington Drivers", National Semiconductor Corporation, Dec. 1995, pp. 1–8.

* "LM140A / LM140 / LM340A / LM7800C Series 3—Terminal Positive Regulators", National Semiconductor Corporation, Jan. 1995, pp. 1–14.

* High End Systems, Inc., Trackspot User Manual, Aug. 1997, Excerpts (Cover, Title page, pp. ii through iii and 2–13 through 2–14).

* Artistic License, AL4000 DMX512 Processors, Revision 3.4, Jun. 2000, Excerpts (Cover, pp. 7,92 through 102).

* Artistic License, Miscellaneous Drawings (3 sheets) Jan. 12, 1995.

* Artistic License, Miscellaneous Documents (2 sheets Feb. 1995 and Apr. 1996).

* Newnes's Dictionary of Electronics, Fourth Edition, S. W. Amos, et al., Preface to First Edition, pp. 278–279.

* "http://www.luminus.cx/projects/chaser", (Nov. 13, 2000), pp. 1–16.

* cited by examiner

*Primary Examiner*—Don Wong
*Assistant Examiner*—Chuc Tran
(74) *Attorney, Agent, or Firm*—Lowrie, Lando & Anastasi, LLP

(57) ABSTRACT

Methods and apparatus for remotely controlled illumination of liquids in a variety of environments. In one example, remotely controlled multi-color LED-based light sources are employed to achieve a wide range of enhanced lighting effects in liquids. In another example, a pool or spa is illuminated by one or more remotely controlled multicolor light sources that may be employed as individually and independently controllable devices, or coupled together to form a remotely controlled networked lighting system to provide a variety of programmable and/or coordinated color illumination effects in the pool or spa environment.

71 Claims, 20 Drawing Sheets

| CONTROLLER | MODE (M) | OPTION (O) |
|---|---|---|
| A | DATA | LOGIC HIGH |
| B | DATA | LOGIC LOW |
| C | LOGIC HIGH | DATA |
| D | LOGIC LOW | DATA |

FIG. 4B

METHODS AND APPARATUS FOR REMOTELY CONTROLLED ILLUMINATION OF LIQUIDS

CROSS REFERENCE TO RELATED APPLICATIONS

This application claims the benefit under 35 U.S.C. §119(e) of the following U.S. provisional application:

U.S. Ser. No. 60/243,250, filed Oct. 25, 2000, entitled ILLUMINATION OF LIQUIDS;

U.S. Ser. No. 60/296,377, filed Jun. 6, 2001, entitled SYSTEMS AND METHODS FOR CONTROLLING LIGHTING SYSTEMS;

U.S. Ser. No. 60/297,828, filed Jun. 13, 2001, entitled SYSTEMS AND METHODS FOR CONTROLLING LIGHTING SYSTEMS; and U.S. Ser. No. 60/290,101, filed May 10, 2001, entitled LIGHTING SYNCHRONIZATION WITHOUT A NETWORK.

This application also claims the benefit under 35 U.S.C. §120 as a continuation-in-part (CIP) of U.S. non-provisional application Ser. No. 09/669,121, filed Sept. 25, 2000, now U.S. Pat. No. 6,806,659 entitled MULTICOLORED LED LIGHTING METHOD AND APPARATUS, which is continuation of U.S. Ser. No. 09/425,770, filed Oct. 22, 1999, now U.S. Pat. No. 6,150,774, which is a continuation of U.S. Ser. No. 08/920,156, filed Aug. 26, 1997, now U.S. Pat. No. 6,016,038.

This application also claims the benefit under 35 U.S.C. §120 as a continuation-in-part (CIP) of the following U.S. non-provisional applications:

U.S. Ser. No. 09/215,624, filed Dec. 17, 1998, now U.S. Pat. No. 6,528,954 entitled SMART LIGHT BULB;

U.S. Ser. No. 09/213,607, filed Dec. 17, 1998, now abandoned entitles SYSTEM AND METHODS FOR SENSOR-RESPONSIVE ILLUMINATION;

U.S. Ser. No. 09/213,189, filed Dec. 17, 1998, now U.S. Pat. No. 6,459,919 entitled PRECISION ILLUMINATION;

U.S. Ser. No. 09/213,581, filed Dec. 17, 1998, entitled KINETIC ILLUMINATION;

U.S. Ser. No. 09/213,540, filed Dec. 17, 1998, now U.S. Pat. No. 6,720,745 entitled DATA DELIVERY TRACK;

U.S. Ser. No. 09/333,739, filed Jun. 15, 1999, entitled DIFFUSE ILLUMINATION SYSTEMS AND METHODS;

U.S. Ser. No. 09/344,699, filed Jun. 25, 1999, entitled METHOD FOR SOFTWARE DRIVEN GENERATION OF MULTIPLE SIMULTANEOUS HIGH SPEED PULSE WIDTH MODULATED SIGNALS;

U.S. Ser. No. 09/616,214, filed Jul. 14, 2000, entitled SYSTEMS AND METHODS FOR AUTHORING LIGHTING SEQUENCES;

U.S. Ser. No. 09/870,418, filed May 31, 2001, entitled METHODS AND APPARATUS FOR AUTHORING AND PLAYING BACK LIGHTING SEQUENCES;

U.S. Ser. No. 09/805,368, filed Mar. 13, 2001, entitled LIGHT-EMITTING DIODE BASED PRODUCTS;

U.S. Ser. No. 09/805,590, filed Mar. 13, 2001, entitled LIGHT-EMITTING DIODE BASED PRODUCTS;

U.S. Ser. No. 09/870,193, filed May 30, 2001, now U.S. Pat. No. 6,608,453 entitled METHODS AND APPARATUS FOR CONTROLLING DEVICES IN A NETWORKED LIGHTING SYSTEM;

U.S. Ser. No. 09/742,017, filed Dec. 20, 2000, now abandoned entitled "Lighting Entertainment System", which is a continuation of U.S. Ser. No. 09/213,548, filed Dec. 17, 1998, now U.S. Pat. No. 6,166,496; and U.S. Ser. No. 09/815,418, filed Mar. 22, 2001, entitled "Lighting Entertainment System", which also is a continuation of U.S. Ser. No. 09/213,548, filed Dec. 17, 1998, now U.S. Pat. No. 6,166,496.

This application also claims the benefit under 35 U.S.C. §120 of each of the following U.S. Provisional Applications, as at least one of the above-identified U.S. Non-provisional Applications similarly Is entitled to the benefit of at least one of the following Provisional Applications:

U.S. Ser. No. 60/071,281, filed Dec. 17, 1997, entitled "Digitally Controlled Light Emitting Diodes Systems and Methods";

U.S. Ser. No. 60/068,792, filed Dec. 24, 1997, entitled "Multi-Color Intelligent Lighting";

U.S. Ser. No. 60/078,861, filed Mar. 20, 1998, entitled "Digital Lighting Systems";

U.S. Ser. No. 60/079,285, filed Mar. 25, 1998, entitled "System and Method for Controlled Illumination"; and U.S. Ser. No. 60/090,920, filed Jun. 26, 1998, entitled "Methods for Software Driven Generation of Multiple Simultaneous High Speed Pulse Width Modulated Signals".

Each of the forgoing applications is hereby incorporated herein by reference.

FIELD OF THE INVENTION

The present invention relates generally to illumination and lighting control. More particularly, the present invention is directed to methods and apparatus for illumination of liquids, including illumination of liquids in environments such as pools or spas.

BACKGROUND

Conventional lighting for various space-illumination applications (e.g., residential, office/workplace, retail, commercial, industrial, recreational, sporting, entertainment and outdoor environments) generally involves light sources coupled to a source of power via manually operated mechanical switches. Some examples of conventional lighting include fluorescent, incandescent, sodium and halogen light sources. Incandescent light sources (e.g., tungsten filament light bulbs) are perhaps most commonly found in residential environments, while fluorescent light sources (e.g., ballast-controlled gas discharge tubes) commonly are used for large lighting installations in office and workplace environments, due to the high efficiency (high intensity per unit power consumed) of such sources. Sodium light sources commonly are used in outdoor environments (e.g., street lighting), and are also recognized for their energy efficiency, whereas halogen light sources may be found in residential and retail environments as more efficient alternatives to incandescent light sources.

Unlike the foregoing lighting examples, light emitting diodes (LEDs) generally are semiconductor-based light sources often employed in low-power instrumentation and appliance applications for indication purposes. LEDs conventionally are available in a variety of colors (e.g., red, green, yellow, blue, white), based on the types of materials used in their fabrication. This color variety of LEDs recently has been exploited to create LED-based light sources having sufficient light output for new space-illumination applications.

For example, as discussed in U.S. Pat. No. 6,016,038, U.S. Pat. No. 6,150,774, U.S. Pat. No. 6,166,496, U.S. Pat.

No. 6,211,626, and U.S. Pat. No. 6,292,901, each of which patents is incorporated herein by reference, multiple differently-colored LEDs may be combined in a lighting fixture, wherein the intensity of the LEDs of each different color is independently controlled (e.g., varied) to produce a number of different hues. In one example of such an apparatus, red, green, and blue LEDs are used in combination to produce literally hundreds of different hues from a single lighting fixture. Additionally, the relative intensities of the red, green, and blue LEDs may be computer controlled, thereby providing a programmable multi-color light source.

Furthermore, as discussed in the aforementioned patents, and additionally in copending U.S. patent application Ser. No. 09/870,193, filed May 30, 2001, entitled METHODS AND APPARATUS FOR CONTROLLING DEVICES IN A NETWORKED LIGHTING SYSTEM, incorporated by reference herein, individual computer controllable LED-based multi-color light sources may be adapted to be coupled together to form a networked lighting system, wherein each light source is independently addressable. In such a network, one or more illumination programs may be executed to strategically route lighting data to any one or more of the independently addressable LED-based multi-color light sources, so as to generate a wide variety of dynamic lighting effects.

SUMMARY OF THE INVENTION

One embodiment of the invention is directed to an apparatus, comprising at least one light source adapted to be supported by one of a pool and a spa to illuminate a liquid contained in the one of the pool and the spa. The at least one light source is further adapted to generate a remotely controllable variable color radiation output to illuminate the liquid without requiring the use of a color filter.

Another embodiment of the invention is directed to a method of illuminating a liquid, comprising acts of: a) illuminating the liquid with variable color radiation that is generated without requiring the use of a color filter, and b) remotely controlling at least a color of the variable color radiation.

Another embodiment of the invention is directed to an apparatus, comprising at least one remote user interface to remotely control at least one light source adapted to be supported by one of a pool and a spa. The light source is further adapted to generate variable color radiation to illuminate a liquid contained in the one of the pool and the spa. The at least one remote user interface comprises at least two selectors to allow a user to remotely control at least one parameter associated with the variable color radiation generated by the at least one light source.

Another embodiment of the invention is directed to an apparatus, comprising at least one controller to control at least one light source, the at least one controller adapted to receive at least two input signals, the at least one controller further adapted to process only particular data received on at least one input signal of the at least two input signals based on a logic state of at least one input signal of the at least two input signals.

BRIEF DESCRIPTION OF THE DRAWINGS

FIG. 4B is a diagram of a truth table showing one example of an addressing scheme for the light source controllers of FIG. 4A, according to one embodiment of the invention;

DETAILED DESCRIPTION

Figure 1:
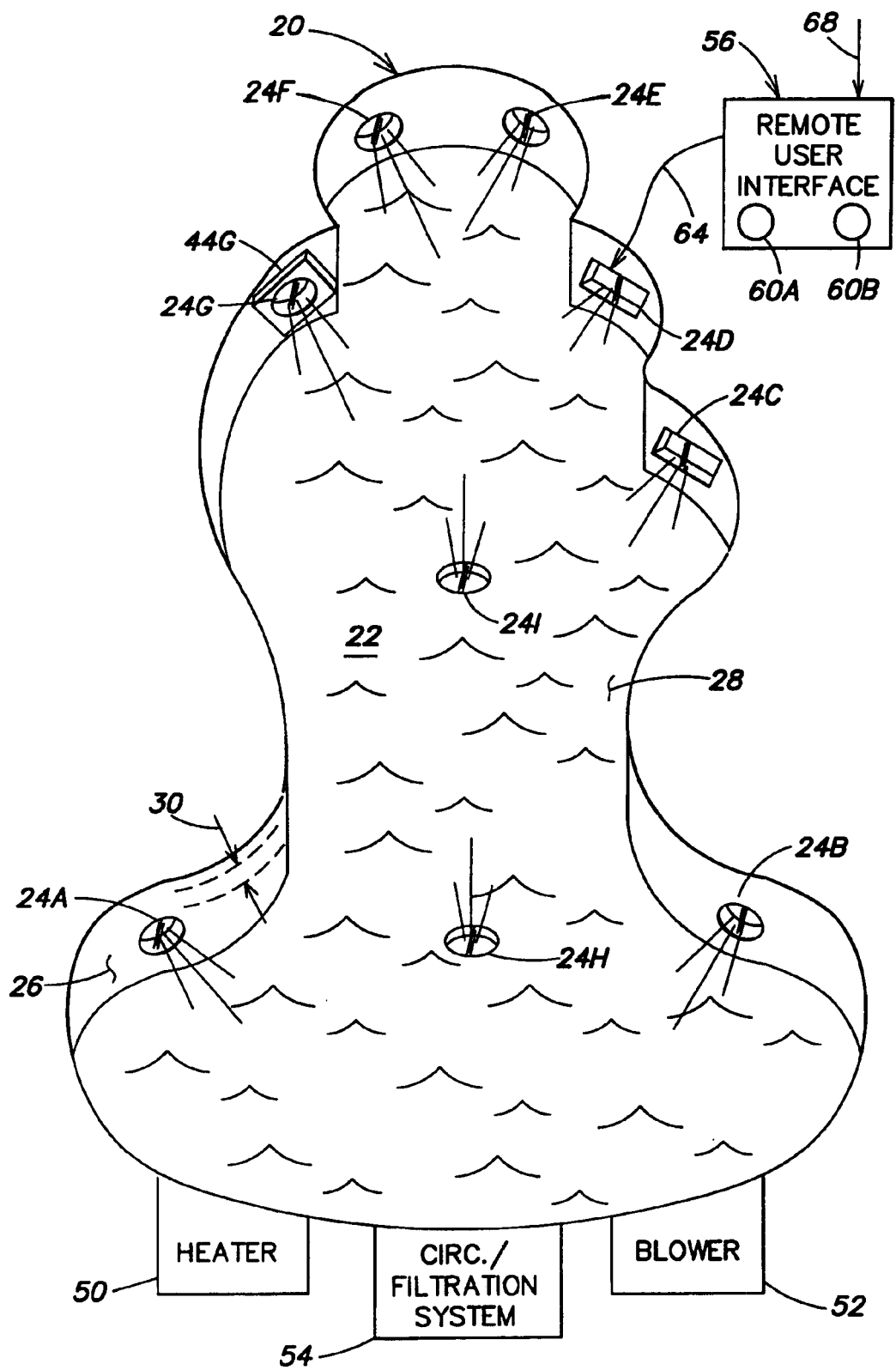
FIG. 1 is a diagram illustrating illumination of a liquid in a pool or spa environment, according to one embodiment of the invention.

Applicants have recognized and appreciated that multi-color LED-based light sources may be adapted to illuminate liquids in a variety of environments (e.g., entertainment, recreational, sporting, therapeutic, utilitarian, etc.) to achieve a wide range of enhanced lighting effects. For example, as discussed in a number of the U.S. patents and patent applications referenced above, multi-color LED-based light sources may be employed to produce a variety of enhanced lighting effects in pools or spas, as well as in other liquid environments. It should be appreciated that the various concepts, methods, apparatus, and systems disclosed in any of the patents and patent applications referenced herein may be applied in various embodiments of the present invention discussed further below directed to the illumination of liquids.

Prior to the introduction of multi-color LED-based light sources in pool or spa environments (as disclosed in U.S. Pat. Nos. 6,016,038 and 6,166,496, for example), pools and spas conventionally were illuminated using standard white light incandescent, fluorescent or halogen lamps. In some cases, pool or spa light fixtures including conventional white light sources are assembled with one or more color filters, in an effort to add color to the light generated by the conventional white light sources. In particular, some conventional pool or spa light fixtures include a number of movable color filters to provide variable color light. In yet other conventional pool or spa lighting systems, fiber optics may be employed to distribute light around the edge of a pool or spa, wherein one end of the fiber optic may be coupled to a conventional white light source generating light through one or more color filters.

Unlike the foregoing conventional systems for illuminating a pool or spa using conventional white light sources and color filters, Applicants have recognized and appreciated that light sources other than conventional white light sources may be particularly adapted and employed to provide multi-color radiation for a variety of liquid illumination applications. Accordingly, one embodiment of the present invention is directed generally to novel methods and apparatus for illumination of liquids.

For example, in one embodiment of the invention, one or more multi-color LED-based light sources are employed to provide enhanced color illumination effects in liquid environments. In one aspect, multi-color LED-based light sources for illumination of liquids generally do not require the use of a color filter to produce color illumination effects. However, it should be appreciated that one or more color filters optionally may be employed with LED-based light sources, as well as other types of light sources, for illumination of liquids according to various embodiments of the invention. Additionally, LED-based multi-color light sources optionally may be used in conjunction with a fiber optic light distribution system for various liquid illumination applications, according to one embodiment of the invention.

Examples of liquid environments that may be illuminated according to various embodiments of the present invention include, but are not limited to, pools, spas, tubs, basins, sinks, water baths, water tanks, fish tanks, aquariums, waterfalls, and fountains. In one aspect of the invention, one or more light sources may be employed to provide enhanced color illumination effects for essentially standing (e.g., stationary) liquids as well as flowing liquids, and similarly may be used to illuminate ice, water vapor, rain, mist, fog, and the like, whether naturally occurring or man made (e.g., produced by a machine). More generally, in various aspects of the present invention, one or more light sources may be used to illuminate any of a variety of liquids that allow radiation generated by the light sources to be at least partially transmitted or reflected.

One embodiment of the present invention is particularly directed to illuminating a liquid in a pool or spa. According to various aspects of this embodiment, one or more multi-color light sources may be employed in a pool or spa environment. In one aspect, such multi-color light sources may be individually and independently controllable (i.e., "stand-alone") devices that each generates multi-color illumination in the liquid contained in the pool or spa. Alternatively, two or more independently controllable and independently addressable multi-color light sources may be coupled together to form a networked lighting system, to provide a variety of programmable and/or coordinated color illumination effects in the pool or spa environment. Specifically, in one embodiment, two or more multi-color light sources coupled together in a networked lighting system may provide dynamic variable color lighting effects in all or only particular sections or portions of a pool or spa.

Additionally, according to one embodiment, one or more multi-color light sources in a pool or spa environment may be remotely controlled to facilitate a number of liquid illumination applications. In one aspect of this embodiment, one or more multicolor light sources in the pool or spa environment may be remotely controlled via one or more remote user interfaces. In another aspect, one or more multi-color light sources may be remotely controlled based on one or more interruptions in the power supplied to the light source(s). In yet another aspect, one or more light sources in the pool or spa environment may be remotely controlled based on information obtained from one or more sensors adapted to output signals in response to one or more detectable conditions in the pool or spa environment. In yet another aspect, one or more light sources in the pool or spa environment may be remotely controlled based on information obtained from a data network, such as the Internet, for example.

In another embodiment of the invention, one or more multi-color light sources in the pool or spa environment may be particularly adapted to execute one or more dynamic variable color illumination programs. In one aspect of this embodiment, the selection of a particular dynamic illumination program from a number of such programs may be indicated to the user via the radiation generated by the one or more light sources. In particular, in one aspect, the selection of a particular dynamic illumination program may be indicated by temporarily modifying one or more variable parameters of the dynamic color variation program that affect the radiation generated by the light sources upon execution of the program.

For example, a particular illumination program may be designed such that, when executed, the radiation output from one or more light sources is varied at some predetermined rate to transition between a number of different colors in succession. Such illumination programs generally may be referred to as dynamic variable color illumination programs, and an example of such an illumination program is a "color wash" program. According to one embodiment of the invention, upon selection of a particular dynamic variable color illumination program, a color variation speed of the program is noticeably increased from the predetermined rate for a short time period (e.g., 1 to 10 seconds) so that a user may recognize that the program has been selected. Thereafter, the color variation speed of the program is automatically decreased to the predetermined rate at which the program is intended to run.

Another embodiment of the invention is directed to generating variable color radiation in a liquid medium to compensate for various radiation absorption and/or scattering effects due to the liquid medium. In this regard, Applicants have recognized and appreciated that many common liquids, such as water, significantly absorb and/or scatter red color, such that it is more difficult for an observer to detect a presence of red color in the liquid than in air, for example. Additionally, Applicants have recognized and appreciated that in some common pool or spa environments, in which the walls and/or floor of a pool or spa may be constructed with a bluish colored vinyl lining, red color also may be significantly absorbed and/or scattered by the vinyl lining.

In view of the foregoing, one embodiment of the invention is directed to a method for generating "liquid hues" to illuminate a liquid, such that when viewed in the liquid by an observer, the liquid hues approximate similar hues observed in non-liquid mediums (e.g., air). More specifically, in one aspect of this embodiment, liquid hues that include radiation having a red color in combination with one or more other colors are generated to approximate a similar hue in a non-liquid medium by increasing the amount of red color included in the liquid hue, so as to compensate for the absorption and/or scattering of the red color in the liquid medium.

As discussed above, one or more dynamic color illumination programs may be executed in a pool or spa environment to realize a variety of illumination effects. Another embodiment of the invention is directed to methods for dynamic color illumination of a liquid medium that take into consideration the various absorption and scattering effects also discussed above. In particular, in one embodiment of the invention, red color appearing alone is omitted from a dynamic variable color illumination program, due to significant absorption and/or scattering of the red color by the illuminated liquid, so as to prevent the appearance of a lapse or break (i.e., absence of illumination) in the illumination program. For example, according to one embodiment, in the "color wash" illumination program discussed above, red color appearing alone is omitted from the color wash program because, relative to other colors radiated in the liquid, an observer would essentially see little or no hue at all in the liquid if red color alone was radiated into the liquid. It should be appreciated, however, that in one aspect of this embodiment, red color radiation may nonetheless be generated in combination with radiation of one or more other colors to produce a variety of liquid hues, as discussed above.

Yet another embodiment of the invention is directed to a multi-color LED-based light source that includes an interface adapted to engage mechanically and electrically with a conventional pool or spa light socket. Some examples of a conventional pool or spa light socket include, but are not limited to, a screw type light socket commonly used for Edison-type incandescent light bulbs, a fluorescent light socket, various types of halogen light sockets, and the like.

For example, in one embodiment, a multi-color LED-based light fixture includes an interface adapted to engage mechanically and electrically with a wedge type light socket commonly found in many commercial pool and spa applications. In one aspect of this embodiment, as well as in other embodiments, the light fixture may include an encapsulant in contact with one or more LEDs (and electrical circuitry associated with the LEDs) to protect these components of the light fixture from moisture. In another aspect of this embodiment, the interface includes a plurality of pins particularly formed, and having particular dimensions, to facilitate mechanical engagement of the light fixture with the wedge type light socket. In yet another aspect, the interface optionally may include a rubber grommet to further facilitate mechanical engagement of the light fixture with the wedge type light socket.

Another embodiment of the invention is directed to a surface mount lighting fixture having a significantly thin depth dimension normal to a surface to which the lighting fixture is mounted. For example, in one aspect of this embodiment, the light fixture has a depth dimension of less than 2.5 inches. In another aspect, the light fixture has a depth dimension of as little as 0.5 inches, and hence is significantly thinner than conventional light sources typically employed in pool or spa environments. In yet another aspect, such a "thin" lighting fixture may include a multi-color LED-based light source to generate variable color radiation. In yet another aspect, the lighting fixture may be adapted to be mounted on a portion of an inner surface of a pool or a spa.

Another embodiment of the invention is directed to methods and apparatus for facilitating the dissipation of heat generated from a light source in a liquid environment. In particular, one embodiment of the invention is directed to a light fixture for use in a liquid environment. In one aspect of this embodiment, the light fixture includes a housing adapted to be at least partially in contact with a liquid. The housing is constructed to prevent one or more light sources supported and enclosed therein from contacting a liquid. The one or more light sources and the housing of the light fixture are particularly adapted such that heat generated by the light sources is effectively absorbed by the liquid via the housing. For example, in one aspect of this embodiment, the light fixture includes a gap pad disposed between the light source and the housing to provide a thermally conductive path between the light source and the housing. In another aspect of this embodiment, the housing includes a back plate in contact with the gap pad, wherein the back plate provides an effective thermal coupling between the light source and the liquid in contact with the housing.

Following below are more detailed descriptions of various concepts related to, and embodiments of, methods and apparatus according to the present invention for the illumination of liquids. It should be appreciated that various aspects of the invention, as discussed above and outlined further below, may be implemented in any of numerous ways as the invention is not limited to any particular manner of implementation. Examples of specific implementations are provided for illustrative purposes only.

FIG. 1 is a diagram illustrating a pool or spa 20 containing a liquid 22 (e.g., water). According to one embodiment of the invention, the pool or spa 20 may be equipped with one or more light sources; for example, FIG. 1 shows a number of light sources 24A–24I, supported by the pool or spa 20, to illuminate the liquid 22. While FIG. 1 shows nine light sources distributed around the pool or spa 20, it should be appreciated that the depiction in FIG. 1 is for purposes of illustration only, and that the invention is not limited in terms of the number or placement of lights sources in the pool and spa environment.

In various aspects of the embodiment shown in FIG. 1, the pool or spa 20, as well as the light sources 24A–24I themselves, may have a variety of different shapes and sizes. For example, while several of the light sources (i.e., 24A, 24B, and 24E–24I) are indicated as having an essentially circular shape in FIG. 1, two of the light sources (i.e., 24C and 24D) are indicated as having a rectangular shape. FIG. 1 also shows that, according to one aspect, the pool or spa 20 may have one or more walls 26 and a floor 28, and that each of the light sources 24A–24I may be supported by one of the wall 26 or the floor 28. It should be appreciated, however, that the invention is not limited in this respect, in that the pool or spa 20 need not have one or more discrete walls 26 and a discrete floor 28. Rather, in other embodiments, the structure of the pool or spa 20 that supports one or more of the light sources 24A–24I as well as the liquid 22 may include a continuously curved inner surface, such that there is no explicit delineation between one or more walls and a floor of the pool or spa 20.

As indicated in FIG. 1, the pool or spa 20 may have a range 30 of typical liquid levels of the liquid 22 during use. FIG. 1 further illustrates that, according to one embodiment, one or more of the light sources 24A–24I are disposed below the range 30 of typical liquid levels. In particular, FIG. 1 explicitly illustrates that at least the light source 24A is disposed below the range 30 of typical liquid levels. In various embodiments discussed further below, one or more of the light sources 24A–24I may be located in a "niche" or indentation in the wall 26 or floor 28 of the pool or spa (not explicitly shown in FIG. 1). In some embodiments, a niche in which a light source is disposed may be adapted to be water tight, such that the light source is prevented from contacting the liquid 22 in the pool or spa. In other embodiments, the niche merely may be an indented deformation in the wall 26 or the floor 28 of the pool or spa, and may be filled with the liquid 22. In yet other embodiments discussed further below, at least some portion of the walls 26 of the pool or spa may be "niche-less," and one or more of the light sources 24A–24I may be mounted on an inner surface of the wall 26 or floor 28 of the pool or spa 20, facing the liquid 22.

In this respect, according to one embodiment of the invention, one or more of the light sources 24A–24I shown in FIG. 1 may be adapted to be submersible in the liquid 22. For example, in one embodiment, one or more of the light sources 24A–24I may include one or more waterproof surfaces or be enclosed in a water tight housing. In particular, for purposes of illustration, FIG. 1 indicates that the light source 24G is disposed in a housing 44G, which may be essentially water tight and/or include one or more waterproof surfaces. While not explicitly shown in FIG. 1, one or more of the other light sources indicated in FIG. 1 also may be associated with a housing. Various housings according to the invention for light sources in a pool or spa environment are discussed further below in connection with FIGS. 3, 11, and 12. In yet another embodiment, discussed in greater detail further below in connection with FIG. 15, one or more of the light sources 24A–24I may include an encapsulant to protect various components of the light source from moisture in the typically humid environment associated with a pool or spa.

FIG. 1 also illustrates that the pool or spa 20 optionally may include one or more heaters 50, blowers 52, and/or circulation and filtration systems 54. Such accessories generally may be employed to condition the pool and spa environment and, more particularly, to condition the liquid 22 contained in the pool or spa 20. For example, such accessories may enhance enjoyment of the pool or spa environment by heating the liquid 22 and/or creating various soothing or invigorating flows of the liquid 22. In one embodiment of the invention, one or more of the light sources 24A–24I are controlled in a coordinated fashion with one or more other accessories (e.g., heaters, blowers, filtration and circulation systems, etc.) in the pool or spa environment. In particular, according to one embodiment, one or more accessories provide control signals to one or more light sources; alternatively, in another embodiment, one or more light sources may provide control signals to one or more accessories, as discussed further below in connection with FIG. 4.

FIG. 1 also illustrates that, according to one embodiment of the invention, one or more remote user interfaces 56 may be employed to control one or more of the light sources 24A–24I associated with the pool or spa 20. In one aspect of this embodiment, one or more user interfaces optionally may be used to additionally control one or more of the other accessories (e.g., heaters, blowers, circulation and filtration systems) associated with the pool or spa 20.

As shown in FIG. 1, a remote user interface 56 according to one embodiment of the invention outputs one or more control signals 64 to one or more of the light sources 24A–24I. For purposes of illustration in FIG. 1, the remote user interface 56 is shown coupled to the light source 24D. It should be appreciated, however, that according to one embodiment of the invention as discussed further below in connection with FIG. 4, two or more of the light sources 24A–24I may be coupled together, and that the remote user interface 56 may be coupled to any one or more of the light sources 24A–24I to facilitate control of the one or more light sources. FIG. 1 also shows that the remote user interface 56 may include one or more selectors 60A and 60B to allow a user to control various aspects of at least the illumination of the liquid 22 in the pool or spa 20. Additionally, FIG. 1 indicates that in one embodiment, the remote user interface 56 may receive one or more external signals 68 used to control various aspects of at least the illumination of the liquid 22 in the pool or spa 20. Further details of various embodiments of the invention directed to a remote user interface for illumination of liquids is discussed below in connection with FIGS. 4–7.

Figure 2:
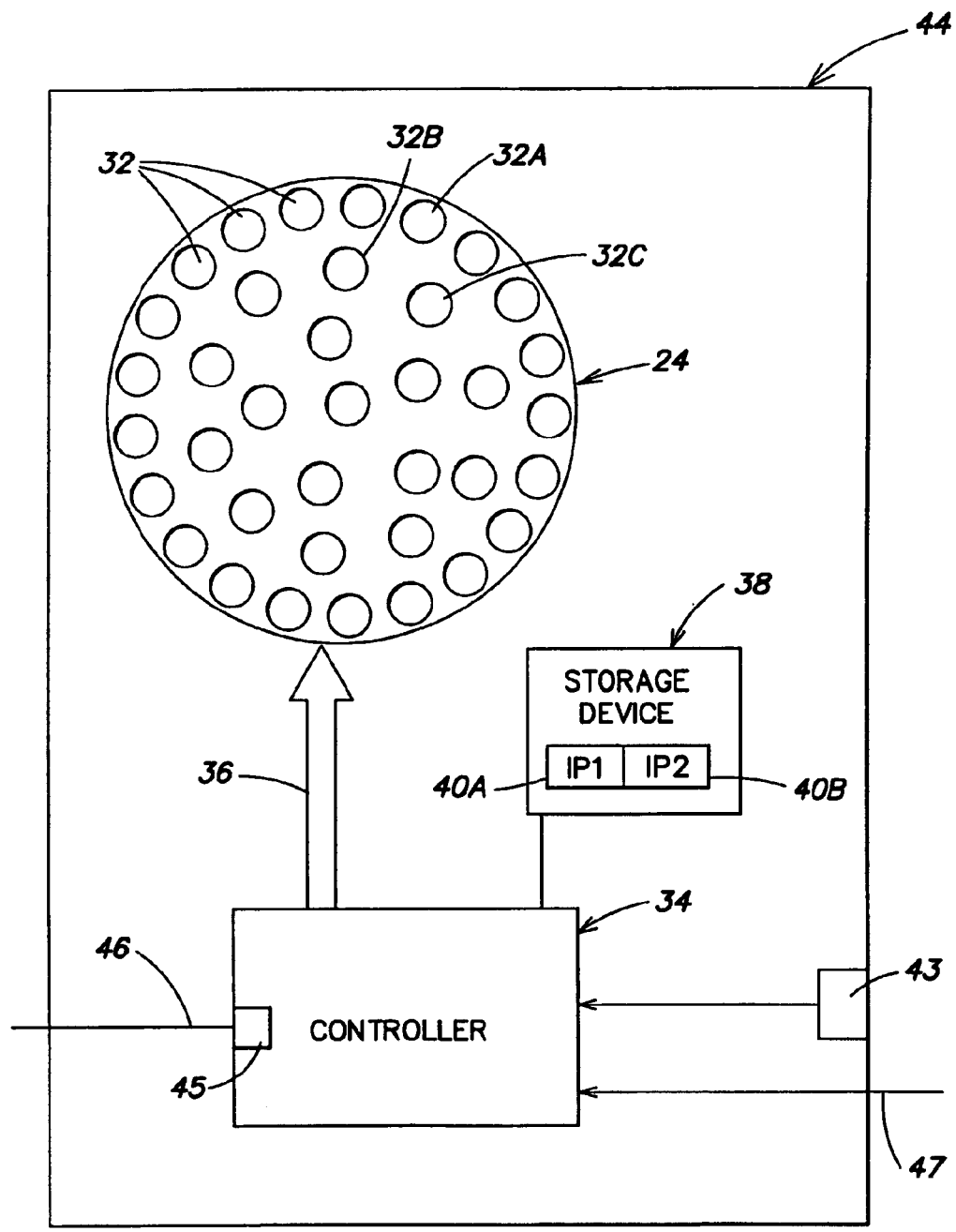
FIG. 2 is a diagram illustrating one example of a light source used for illumination in a pool or spa environment such as that shown in FIG. 1, according to one embodiment of the invention.

FIG. 2 is a diagram illustrating an exemplary light source 24, according to one embodiment of the invention, that may be representative of any one of the light sources 24A–24I in the pool or spa environment shown in FIG. 1. In particular, FIG. 2 illustrates the light source 24 and other components that may be associated with the light source 24 according to various embodiments of the invention. In one embodiment, the light source 24 and one or more other associated components (discussed further below) may be included together in a housing 44 supported by the pool or spa 20 shown in FIG. 1. In other embodiments discussed further below in connection with FIGS. 13–15, the light source 24 and one or more other associated components may be included together in various forms as a lighting fixture that is adapted to engage mechanically and electrically with a conventional pool or spa light socket supported by the pool or spa 20 shown in FIG. 1.

With reference again to FIG. 2, the light source 24 according to one embodiment of the invention may include one or more LEDs 32. More specifically, in one aspect of this embodiment, the light source 24 may include two or more differently colored LEDs (indicated as 32A, 32B, and 32C in FIG. 2), wherein the intensity of the LEDs of each different color may be independently varied to produce a number of different hues. In the light source 24 shown in FIG. 2, it should be appreciated that any number of LEDs 32 may be included in the light source, and that multiple LEDs of the same color may be distributed throughout the light source 24 in a variety of manners.

U.S. Pat. Nos. 6,016,038, 6,150,774, 6,166,496, 6,211,626, and 6,292,901 disclose examples of multi-color LED-based light sources representative of the light source 24 shown in FIG. 2, wherein red, green, and blue LEDs are used in combination to produce literally hundreds of different hues, without requiring the use of a color filter. In this respect, in one aspect of the embodiment shown in FIG. 2, the light fixture 24 may include at least one red LED 32A, at least one green LED 32B, and at least one blue LED 32C. Accordingly, it should be appreciated that in one embodiment of the invention, within the housing 44 shown in FIG. 2, the light source 24 may include a number of independently controllable light sources in the form of independently controllable differently colored LEDs 32A, 32B, and 32C.

FIG. 2 also shows that one or more controllers 34 may be associated with the light source 24 to control radiation output by the light source. For example, according to one embodiment, the controller 34 shown in FIG. 2 may be adapted to control a color of the overall radiation output by the light source 24 by individually and independently controlling the intensity of each of the differently colored LEDs 32A, 32B and 32C.

In particular, according to one aspect of this embodiment, the controller 34 of FIG. 2 outputs one or more control signals 36 to the light source 24, wherein the control signal(s) may include one or more pulse width modulated signals. Pulse-width-modulated signal control of LEDs is discussed in detail in the U.S. patents referred to above, as well as in U.S. application Ser. No. 09/344,699 entitled "Method for Software Driven Generation of Multiple Simultaneous High-Speed Pulse Width Modulated Signals," which application is incorporated herein by reference. As discussed in the foregoing references, a pulse width modulated signal, which includes rapid successions of pulsed current provided to one or more LEDs of the light source 24, creates the effect of a constant light output from the light source, without human perceptible flicker. In this technique, the duty cycle of a pulse width modulated signal serving as the control signal 36 (intended for one or more LEDs of a particular color) is adjusted based on the desired intensity of the radiation output by the particularly colored LED(s). In an alternative method of LED control according to another embodiment, one or more control signals 36 output by the controller 34 to the light source 24 may include one or more variable analog signals to adjust the relative intensities of differently colored LEDs of the light source 24.

FIG. 2 also shows that, according to one embodiment, one or more storage devices 38 may be coupled to the controller 34 to store one or more illumination programs. Examples of various storage devices suitable for purposes of the present invention include, but are not limited to, RAM, PROM, EPROM, EEPROM, CD, DVD, optical disks, floppy disks, magnetic tape media, and the like. FIG. 2 shows that, in one embodiment, the storage device 38 stores at least a first illumination program 40A and a second illumination program 40B. In one aspect of this embodiment, the controller 34 is adapted to execute one or more illumination programs so as to control the radiation output by the light source 24.

For example, in one aspect, a given illumination program may include information that enables the controller to adjust the intensity one or more LEDs of each different color for particular time periods, so as to create a wide variety of variable color dynamic illumination effects. In another aspect, one or more illumination programs may utilize the DMX data protocol, as discussed in the various U.S. patents and patent applications referenced above, and the controller may be particularly adapted to execute programs utilizing the DMX data protocol.

According to one embodiment, the storage device 38 may be a removable storage device (e.g., the housing 44 may be adapted to facilitate removal of the storage device 38). In yet another embodiment, the storage device 38 may be located exterior to the housing 44. In either case, according to one aspect of these embodiments, a given removable or "changeable" storage device 38 may be pre-programmed with one or more particular illumination programs or a particular set of illumination programs. In this aspect, a user could change storage devices to acquire different illumination programs for the liquid illumination environment. In another aspect of this embodiment, an example of a business method utilizing such removable or changeable storage devices would be to have a retail store selling storage devices for liquid illumination environments with preloaded illumination programs, and/or providing a service to download illumination programs (e.g., from a central storage location at the store) to a blank storage device sold at the store. In yet another embodiment, one or more fixed or removable storage devices 38 may be programmed with illumination programs downloaded from a data network, or from a web site on the Internet. In one aspect of this embodiment, information from the data network or Internet web site may be provided to the storage device as one or more external signals 46 via the controller 34.

According to one embodiment, the controller 34 shown in FIG. 2 receives a power signal 47 to provide power to the light source 24. In various aspects of this embodiment, the power signal 47 may be provided directly by either an A.C. or D.C. power source. According to one aspect of this embodiment, an A.C. to D.C. converter (not shown in FIG. 2) may be utilized to convert an A.C. power source to a D.C. voltage. The A.C. to D.C. converter may be included in the controller 34 itself, or may be located externally to the controller 34, such that a low voltage D.C. power signal (derived from an A.C. power signal) is provided to the controller 34 as the power signal 47. According to another aspect of this embodiment, such an arrangement facilitates safe operation of one or more light sources 24 when used in liquid illumination applications.

FIG. 2 also shows that, according to one embodiment, the controller 34 may include one or more inputs 45 to receive one or more external signals 46. In one aspect of this embodiment, the controller 34 is adapted such that one or more parameters (e.g., a color) of the radiation output by the light source 24 is controlled based on one or more external signals 46. In this regard, according to one aspect of this embodiment, the radiation generated by the light source 24 may be remotely controllable.

For example, according to one embodiment discussed further below, one or more external signals 46 may be derived from one or more remote user interfaces (e.g., the remote user interface 56 shown in FIG. 1). In one aspect of this embodiment, the remote user interface 56 is not in contact with or supported by the light source 24 or the controller 34 (e.g., the user interface is not supported by the housing 44); rather, the user interface is located remotely from the light source 24 and only coupled to the light source (e.g., via the controller 34) by virtue of some form of communication link, which may be a wire (cable), fiber optic, or wireless link).

In other embodiments, one or more external signals 46 provided to the controller 34 shown in FIG. 2 may be derived from one or more sensors adapted to output signals in response to one or more detectable conditions (e.g., of the environment in or around the pool or spa 20 shown in FIG. 1). Similarly, one or more external signals 46 may be derived from one or more audio signals, such that radiation generated by the light source 24 may be controlled based on the audio signal(s). Likewise, one or more external signals 46 may be derived from a data network, as discussed further below in connection with FIG. 4.

In another embodiment, the power signal 47 indicated in FIG. 2 may serve as an external signal 46, and the controller 34 may be adapted such that one or more parameters (e.g., a color) of the radiation output by the light source 24 is controlled based on one or more interruptions in the power signal 47. In yet another embodiment, one or more external signals 46 may be derived from one or more other devices or accessories associated with the pool or spa 20 shown in FIG. 1. For example, as discussed above in connection with FIG. 1, one or more of the heater 50, blower 52, or circulation and filtration system 54 may provide one or more signals from which one or more external signals 46 may be derived, such that one or more of these other devices controls the radiation output by the light source 24.

While not shown explicitly in FIG. 2, according to one embodiment, the controller 34 may be adapted to receive a first external signal $46_1$, designated as an "options" signal, and a second external signal $46_2$, designated as a "mode" signal, via respective inputs $45_1$ and $45_2$ of the controller 34. In one aspect of this embodiment, the respective "mode" and "options" signals facilitate operation of the controller 34 (and, hence, the light source 24) with a remote user interface 56, as shown in FIG. 1 and discussed further below in connection with FIGS. 4–7. In particular, according to one embodiment, the light source 24, via the controller 34, may be operated as a "stand-alone" independently controllable device via a remote user interface that generates the "mode" and "options" signals, respectively, to control the device.

For example, according to one aspect of this embodiment, the controller 34 adapted to receive the mode and options signals may be controlled using a remote user interface 56 having two or more selectors 60A and 60B, as shown for example in FIG. 1. In one aspect, a first selector 60A of the remote user interface 56, when activated by a user, would generate a "mode" signal, whereas a second selector 60B would generate an "options" signal. In FIG. 1, an output of the remote user interface 56 is shown generally as the signal 64; however, it should be appreciated that, according to one embodiment, the signal 64 output from the remote user interface 56 may include a first output signal $64_1$ (corresponding to the "options" signal $46_1$ input to the controller 34) and a second output signal $64_2$ (corresponding to the "mode" signal $46_2$ input to the controller 34).

According to one aspect of this embodiment, a "mode" signal generated by the remote user interface 56 may be used to select one of a number of illumination programs stored in the storage device 38 shown in FIG. 2, as discussed above. Likewise, according to another aspect, the "options" signal generated by the remote user interface 56 may be used to adjust one or more variable parameters of a selected illumination program. For example, in one embodiment, a user may operate the first selector 60A to generate a "mode" signal which sequentially toggles through a number of illumination programs stored on the storage device 38, to select the particular illumination program, for example, "color wash". In one aspect of this embodiment, the "color wash" program may have an adjustable color variation speed (discussed further below). Accordingly, upon selection of the "color wash" program via the selector 60A, the user may activate the selector 60B, which generates an "options" signal from the remote user interface 56 and allows the user to change the color variation speed of the "color wash" program. It should be appreciated, however, that the invention is not limited to the foregoing example, as a number of different illumination programs having a variety of adjustable parameters may be selected and tailored by a user in a manner similar to that discussed above.

According to another embodiment, respective "mode" and "options" signals applied to a controller 34 may be used to appropriately configure a number of controllers for operation in a networked lighting system. The use of "mode" and "options" signals in this manner are discussed further below in connection with FIGS. 4A and 4B.

According to one embodiment, a local user interface 43 may be associated with the controller 34 shown in FIG. 2 to facilitate user selection of one or more operating modes of the controller 34 and the light source 24. For example, in one aspect of this embodiment, the local user interface 43 may be a button, switch, dial, or any other interface or combination of interfaces that facilitates selection of one or more of the illumination programs 40A and 40B stored in the storage device 38. Additionally, according to another aspect of this embodiment, each illumination program may have one or more adjustable parameters, and the local user interface 43 may be employed to vary one or more of the adjustable parameters of the illumination programs.

In connection with the foregoing discussion of FIG. 2, it should be appreciated that the invention is not limited to the particular components and arrangement of components shown in FIG. 2, and that the particular implementation shown in FIG. 2 is depicted for purposes of illustration only. For example, according to other embodiments, the storage device 38 may not be included in a housing 44 for the light source 24, and the controller 34 may receive illumination program information from a remote source via one or more external signals 46. Likewise, according to other embodiments, the controller 34 itself may not be included in the housing 44 along with the light source 24. Also, the local user interface 43 need not necessarily be included in an apparatus according to one embodiment of the invention. In general, it should be appreciated that, according to the present invention, numerous implementations of a light source 24, as well as one or more other components associated with the light source 24, are suitable for the illumination of liquids.

Figure 3:
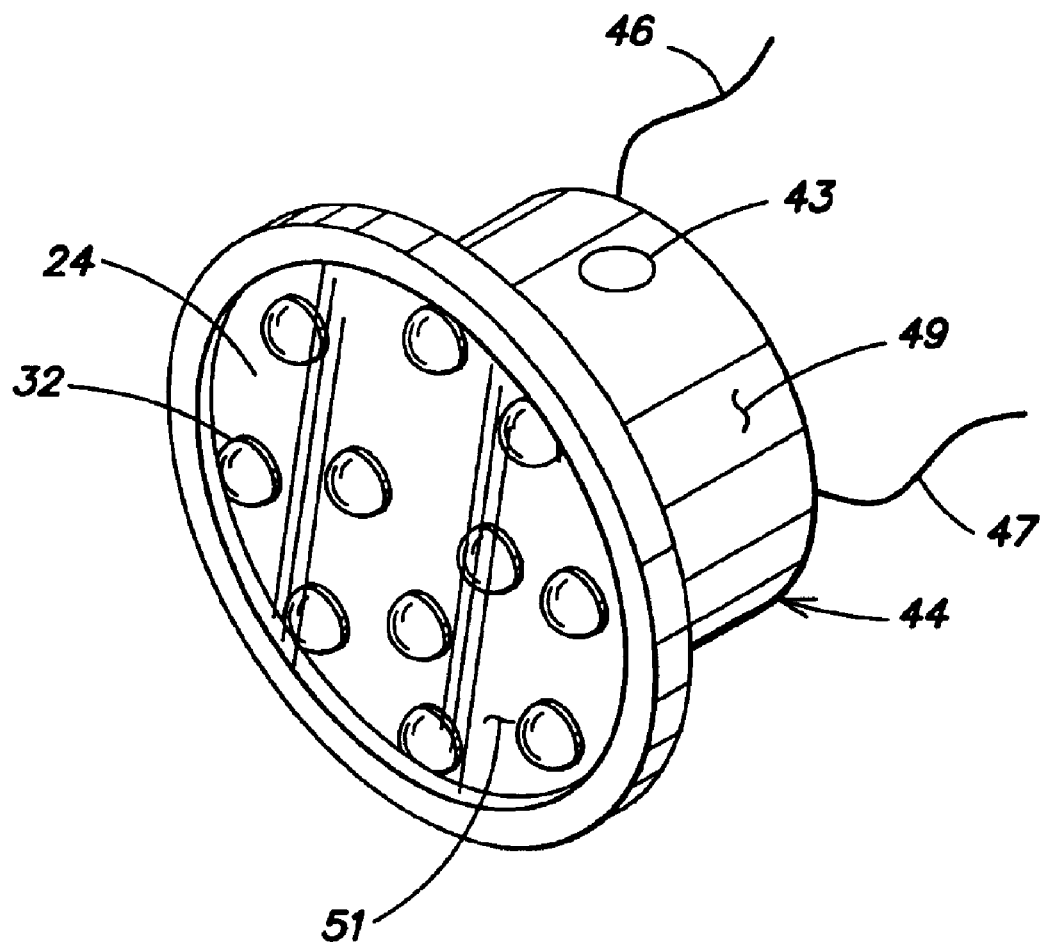
FIG. 3 is a diagram illustrating another example of a light source used for illumination in a pool or spa environment such as that shown in FIG. 1, according to one embodiment of the invention.

FIG. 3 is a diagram illustrating an example of a housing 44 for a light source 24, according to one embodiment of the invention. In one aspect of the embodiment shown in FIG. 3, the housing 44 may include at least one waterproof or water resistant surface 49, as discussed above in connection with FIG. 1. Additionally, in another aspect, the housing 44 may include a waterproof lens 51 that is substantially light transmissive, but nonetheless prevents the light source 24 from contacting a liquid. In various embodiments, the housing 44 may contain one or more light sources 24, and also may contain one or more other components associated with the light source 24, as discussed above in connection with FIG. 2. For example, according to one embodiment, the housing 44 may include at least the light source 24 and the controller 34 shown in FIG. 2, and optionally also may include one or more storage devices 38. FIG. 3 also shows that the housing 44 may be adapted to support one or more local user interfaces 43, and be equipped with connections to receive one or more external signals 46 and a power signal 47.

With reference again to the discussion in connection with FIG. 1 and, more particularly, the light source 24G and the housing 44G shown in the wall 26 of the pool or spa 20 of FIG. 1, a housing similar to that shown in FIG. 3 may be mounted on a portion of an inner surface of the wall 26 using a variety of mounting mechanisms, such that the housing 44 does not protrude through the wall 26 of the pool or spa 20. This type of mounting arrangement for a lighting fixture in a pool or spa conventionally is referred to as "niche-less" lighting. Alternatively, in yet another embodiment, a hole may be cut in the wall 26 of the pool or spa 20, and the housing 44 shown in FIG. 3 may be mounted to the wall such that at least a portion of the body of the housing 44 protrudes through the wall 26 of the pool or spa 20. In one aspect of this embodiment, the housing 44 is adapted to make a watertight seal with the inner surface of the wall 26 such that the liquid 22 in the pool or spa 20 is unable to leak through the hole containing the housing 44. In yet another embodiment of the invention, a "niche" may be constructed in the wall 26 of the pool or spa, and the niche itself may serve as a portion of the housing 44 containing the light source 24 and possibly one or more other components associated with the light source. Various embodiments of the invention directed to light fixtures and arrangements for supporting one or more light fixtures in a pool or spa environment are discussed further below in connection with FIGS. 11–15.

Figure 4:
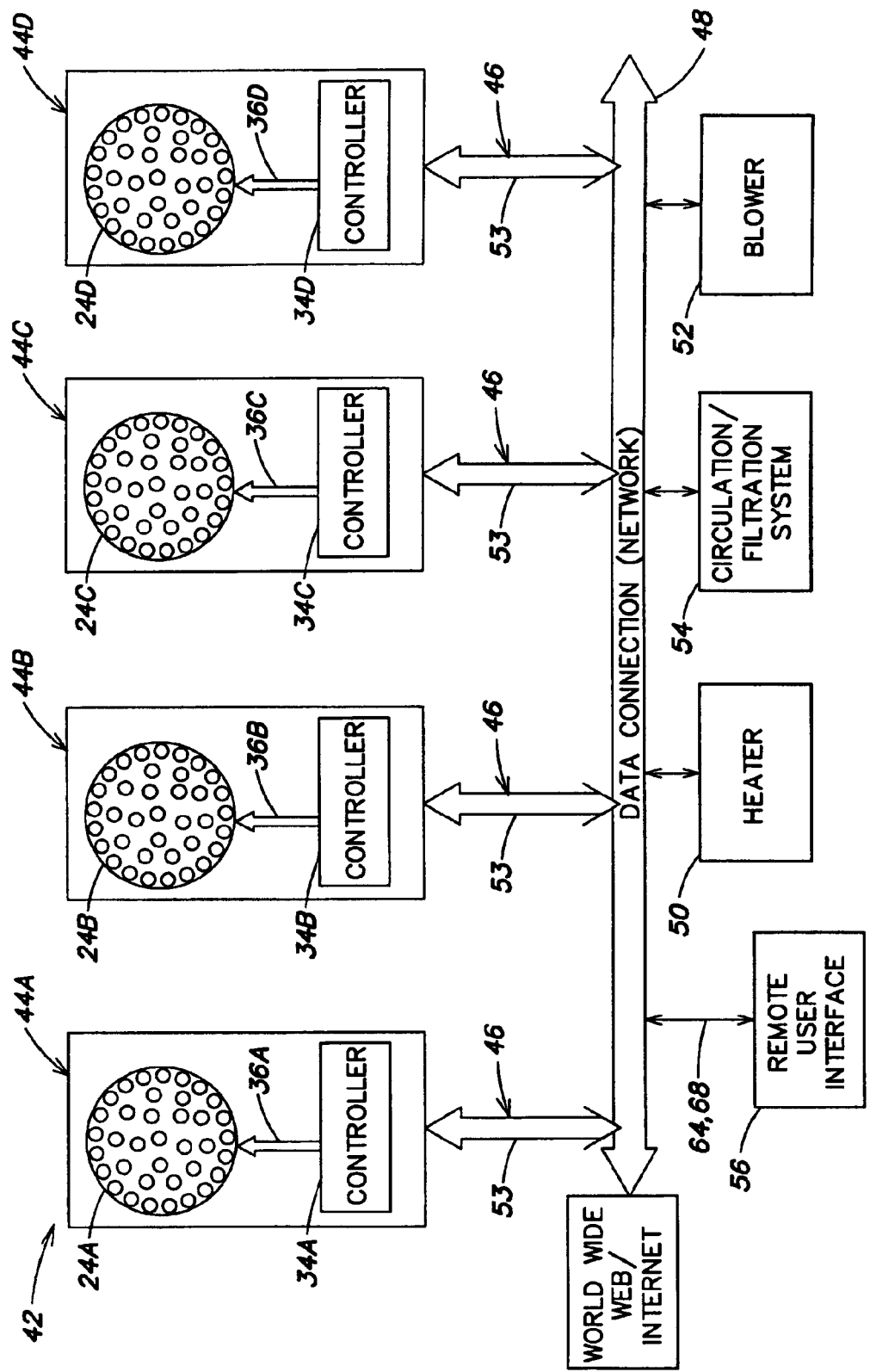
FIG. 4 is a diagram of a networked lighting system for illumination in a pool or spa environment such as that shown in FIG. 1, according to one embodiment of the invention.

FIG. 4 is a diagram illustrating one example of a networked lighting system 42 employed in the pool or spa environment shown in FIG. 1, according to one embodiment of the invention. As discussed above in connection with FIG. 1, one or more light sources 24A–24I supported by the pool or spa 20 each may serve as a "stand-alone" illumination source, and may be adapted to be individually and independently controllable to produce a variety of variable color lighting effects. Alternatively, as shown in the embodiment of FIG. 4, two or more light sources may be coupled together, along with one or more other devices associated with the pool or spa environment, to form a networked lighting system 42. Various networked lighting systems suitable for use in the pool and spa environment shown in FIG. 1 are discussed in the U.S. patents referenced above, as well as U.S. patent application Ser. No. 09/870,193, filed May 30, 2001, entitled METHODS AND APPARATUS FOR CONTROLLING DEVICES IN A NETWORKED LIGHTING SYSTEM, incorporated herein by reference.

By way of example, FIG. 4 illustrates four of the light sources 24A–24D shown supported by the pool or spa 20 in FIG. 1. Although FIG. 4 shows four light sources 24A–24D coupled together to form the networked lighting system 42, it should be appreciated that the invention is not limited in this respect, as any two or more of the light sources shown in FIG. 1 may be coupled together to form the networked lighting system 42.

FIG. 4 illustrates that each of the light sources 24A–24D receives one or more external signals 46 from a data connection or network 48. Each of the light sources in FIG. 4 also may be adapted to transmit one or more output signals 53 to the network 48. FIG. 4 also illustrates that the network 48 may be coupled to one or more other devices associated with the pool or spa environment (e.g., the heater 50, the circulation and filtration system 54, the blower 52, and one or more remote user interfaces 56) and also may be coupled to the Internet (World Wide Web). It should be appreciated that, according to various embodiments, the network 48 may comprise any one or more of a variety of communication media, including, but not limited to, wire cable, fiber optic, and wireless links that support one or more of radio frequency (RF), infrared (IR), microwave communication techniques, for example.

In the networked lighting system 42 shown in FIG. 4, according to one embodiment, one light source coupled to the network 48 may act as a "master" to control one or more other "slave" light sources and/or other devices coupled to the network 48. Additionally, while not shown explicitly in FIG. 4, the network 48 may be coupled to one or more processors that may serve to coordinate the various functions of different devices associated with the pool or spa, including the light sources 24A–24D and other accessories. In one embodiment discussed further below in connection with FIGS. 5–7, a remote user interface 56 may serve as a central processor to coordinate the various functions of the networked lighting system 42.

According to one embodiment, each of the controllers 34A–34D shown in FIG. 4 (respectively associated with the light sources 24A–24D) may include one or more independently controllable output ports to provide one or more control signals 36A–36D respectively to the light sources 24A–24D, based on one or more external signals 46 received by the controllers from the data network 48. In one aspect of this embodiment, a given controller's output ports are "independently controllable," in that the controller receives data on the network 48 and appropriately routes particular portions of the received data that is intended for the controller's respective output ports. In another aspect of this embodiment, a given controller is "independently addressable," in that the controller may receive data intended for multiple controllers coupled to the network 48, but selectively "picks-off" particular data from the network intended for the one or more output ports supported by the controller.

More specifically, in the networked lighting system 42 of FIG. 4, according to one embodiment, individual LEDs or groups of same color LEDs of each light source 24A–24D are coupled to independently controllable output ports of the controller associated with the light source. By virtue of the independently addressable controllers, individual LEDs or groups of same color LEDs of each light source may be controlled independently of one another based on various control information (e.g., data) transported throughout the network. In this manner, each light source 24A–24D may be independently controlled, and multiple light sources coupled to the network 48 may be independently controlled in a coordinated manner to achieve a variety of enhanced color lighting effects around all or a portion of the pool or spa 20 shown in FIG. 1.

According to yet another embodiment of the invention directed to a networked lighting system 42 as shown in FIG. 4, one or more other devices associated with the pool or spa 20, such as the heater 50, the blower 52, and the circulation or filtration system 54, may control one or more of the light sources 24A–24D coupled to the data network 48. For example, in one aspect of this embodiment, illumination conditions created by one or more of the light sources 24A–24D may particularly indicate activation of one or more of the other devices or accessories associated with the pool or spa. Some illustrative examples of this embodiment include changing illumination conditions in the pool or spa to a particular color when the heater 50 is activated, or changing the illumination conditions to one or more other particular colors when one or more blowers 52 comes on to agitate the liquid 22 in the pool or spa 20. Similarly, one or more of the light sources 24A–24D can generate a particular illumination condition in the pool or spa 20 indicating any number of events associated with one or more other devices or accessories associated with the pool or spa 20.

In yet another embodiment of the invention, one or more of the light sources 24A or 24D also may control one or more other devices or accessories associated with the pool or spa that are coupled to the network 48. For example, in one aspect of this embodiment, one or more of the other devices or accessories may be activated to create a particular condition in the liquid 22 contained in the pool or spa 20 when one or more of the light sources 24A–24D generate a particular illumination condition in the pool or spa (e.g., when the color green is generated, the circulation system creates a whirlpool in the liquid 22).

FIG. 4 also illustrates that, according to one embodiment of the invention, one or more remote user interfaces 56 may be coupled to the network 48 to control one or more of the light sources 24A–24D and optionally other devices and accessories associated with the pool or spa 20 shown in FIG. 1. According to various embodiments of the invention, a remote user interface 56 may be a relatively simple device including one or more selectors and minimal circuitry to allow a user to remotely control at least a color of the variable color radiation output of one or more of the light sources 24A–24D coupled to the network 48. Alternatively, as discussed further below in connection with FIGS. 5–7, the remote user interface 56 optionally may include one or more processors, storage devices, a number of different types of selectors operable by a user, as well as a display, to provide a sophisticated interface for control of the network lighting system 42 associated with the pool or spa 20 shown in FIG. 1. In one aspect of these embodiments, some type of remote user interface 56 may be included in a control panel along with other pool or spa controls at some central location in the pool and spa environment. In yet another aspect, the remote user interface 56 may be an essentially mobile device that one or more users may transport to different locations in and around the pool or spa environment.

According to another embodiment of the invention, as illustrated in FIG. 4, the network 48 associated with the networked lighting system 42 may be coupled to the Internet (World Wide Web). According to one aspect of this embodiment, one or more light sources 24A–24D of the networked lighting system 42 may be controlled based on information obtained from the Internet. For example, in one aspect of this embodiment, information obtained from the Internet may be related to one or more weather conditions in the vicinity of the pool or spa 20 shown in FIG. 1. In this aspect, one or more of the light sources 24A–24D, as well as one or more other devices or accessories associated with the pool or spa 20, may be controlled to change the pool or spa environment based on the weather information (whether obtained via the Internet or otherwise). For example, in one aspect of this embodiment, if weather information obtained from any of a variety of sources, including the Internet, indicates that thunderstorms are approaching the area of the pool or spa 20, one or more of the light sources 24A–24D may be controlled to indicate an emergency situation (e.g., the liquid 22 in the pool or spa 20 could be illuminated to flash quickly on a particular color).

Figure 4A:
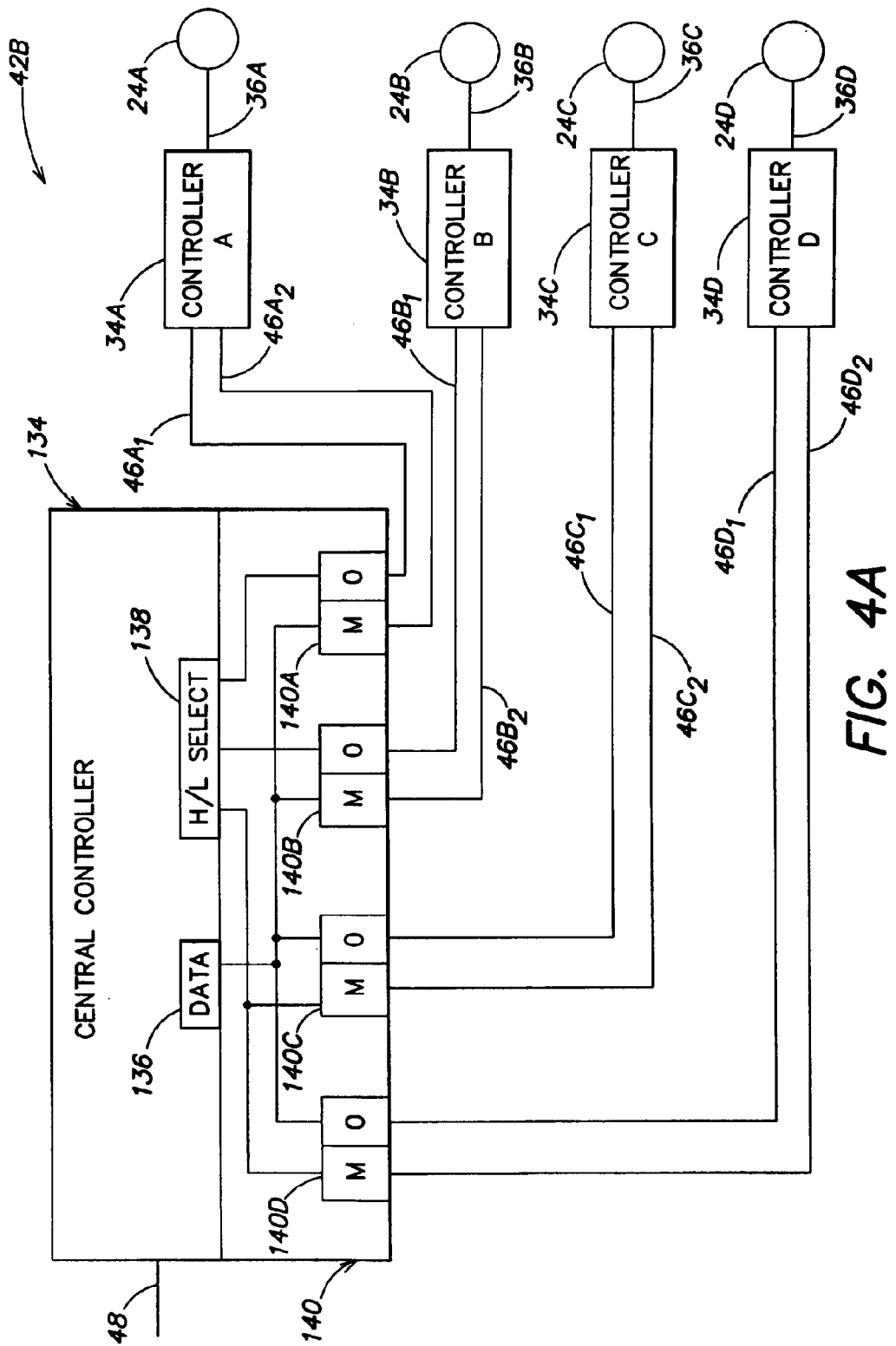
FIG. 4A is a diagram of a networked lighting system for illumination in a pool or spa environment such as that shown in FIG. 1, according to another embodiment of the invention.

FIG. 4A is a diagram illustrating another example of a networked lighting system 42B that may be employed in the pool or spa environment shown in FIG. 1, according to one embodiment of the invention. In the embodiment of FIG. 4A, a central controller 134 coupled to the network 48 is adapted to control four light sources 24A–24D respectively associated with four controllers 34A–34D. In one aspect of this embodiment, each of the controllers 34A–34D is adapted to receive at least two input signals. In particular, as discussed above in connection with FIG. 2, in one aspect, each of the controllers 34A–34D is adapted to receive a "mode" signal and an "options" signal. For example, FIG. 4A shows that the controller 34A receives a first signal 46A$_1$ (an "options" signal) and a second signal 46A$_2$ (a "mode" signal). The other controllers 34B–34D shown in FIG. 4A are designated similarly.

As illustrated in FIG. 4A, according to one embodiment, the central controller 134 may be equipped with a connection block 140 to provide connections to the controllers 34A–34D. In particular, in one aspect of this embodiment, the connection block 140 includes a plurality of sub-blocks 140A–140D respectively allocated for the controllers 34A–34D. For example, in FIG. 4A, the controller 34A is connected to the sub-block 140A, the controller 34B is connected to the sub-block 140B, and so on. According to another aspect, each of the sub-blocks 140A–140D includes two terminals, a first terminal designated as "M" (i.e., for "mode" signal) and a second terminal designated as "O" (i.e., for "options" signal).

In one aspect of the embodiment shown in FIG. 4A, the central controller 134 outputs a data signal 136 and a logic high/low (H/L) select signal 138 to the controllers 34A–34D of the networked lighting system 42B. In another aspect of this embodiment, the particular data that each of the controllers 34A–34D receives depends on the manner of connection of each controller's "mode" and "options" signal inputs to the data signal 136 and the H/L select signal 138 of the central controller 134. Stated differently, according to one aspect of this embodiment, an "address" of each of the controllers 34A–34D in the networked lighting system 42B is determined at least in part by the particular manner in which the controllers 34A–34D are connected to the central controller 134.

FIG. 4B is a diagram showing a truth table, which illustrates one example of how the controllers 34A–34D in the networked lighting system 42B of FIG. 4A may be "addressed" by the central controller 134, according to one embodiment of the invention. The truth table shown in FIG. 4B is based on the particular interconnections between the controllers 34A–34D and the central controller 134 indicated in the connection block 140 shown in FIG. 4A. For example, according to the truth table of FIG. 4B, the "mode" signal input 46A$_2$ of the controller 34A (coupled to the "M" terminal of the connection sub-block 140A) is provided with data from the data signal 136 of the central controller 134. As also indicated in the truth table, the controller 34A processes this data as data intended for it while the "option" signal input 46A$_1$ to the controller 34A (coupled to the "O" terminal of the connection sub-block 140A) is in a logic high state, as dictated by the H/L select signal 138 of the central controller 134. In a similar manner, the truth table in FIG. 4B indicates that the "mode" signal input 46B$_2$ of the controller 34B (coupled to the "M" terminal of the connection sub-block 140B) also is provided with data from the data signal 136 of the central controller 134. The controller 34B processes this data as data intended for it while the "option" signal input 46B$_1$ to the controller 34B (coupled to the "O" terminal of the connection sub-block 140B) is in a logic low state, as dictated by the H/L select signal 138 of the central controller 134. The truth table in FIG. 4B may be interpreted similarly for the controllers 34C and 34D, based on the connections indicated in FIG. 4A.

According to another aspect of this embodiment, each of the controllers 34A–34D shown in FIG. 4A may be particularly adapted to distinguish between stationary logic level signals and more rapidly changing data signals applied to the "mode" and "options" signal inputs of each controller, so as to appropriately decode these signals in order to realize the addressing scheme outlined in the truth table of FIG. 4B. For example, according to one embodiment, each controller monitors a signal rate (e.g., rate of switching between high and low logic states) on each of its "mode" and "options" signal inputs, based, for example, on an expected data rate from the central controller 134, to determine which one of the data signal 136 and the H/L select signal 138 a given "mode" or "options" signal input is connected to. Based on the periodic monitoring of the signal rate of its "mode" and "options" signals, and the conditions indicated in the truth table of FIG. 4B, each controller can effectively select and process data particularly intended for it, as output by the central controller 134.

In yet another aspect of this embodiment, if a controller does not detect the presence of a data signal on either of the "mode" or "options" signal inputs (e.g., for some predetermined time), the controller may automatically default to a "stand-alone" mode. In the "stand-alone" mode, as discussed above in connection with FIG. 2 and further below in connection with other figures, a controller may be controlled by a remote interface (e.g., coupled to the "mode" and "options" signal inputs), and/or may respond to a variety of other external signals. Alternatively, the controller may automatically begin execution of one or more pre-programmed illumination programs.

In another embodiment of the invention, two or more independently controllable light sources of the pool or spa environment shown in FIG. 1 may be synchronized without necessarily being coupled to a network (e.g., as illustrated in FIGS. 4 and 4A) by monitoring a line frequency of the power supplied to the light sources. Examples of this technique are discussed in greater detail in U.S. provisional application Ser. No. 60/290,101, entitled LIGHTING SYNCHRONIZATION WITHOUT A NETWORK, incorporated herein by reference. In this technique, two or more light sources may be connected to the same source of power (e.g., with reference to FIG. 2, the controller 34 of each light source 24 may be coupled to a power signal 47 from a common source of power, or common power circuit). In one aspect of this embodiment, each of the controllers coupled to the common power circuit monitors the line frequency of the power signal 47 and executes any one of a number of illumination programs in synchronization with the line frequency of the power signal 47. In this manner, multiple light sources may execute the same illumination program in synchronization, without necessarily being coupled to a data network.

In another aspect of this embodiment, two controllers 34 respectively may be coupled to power signals 47 originating from different power circuits. As a result, the line frequencies of the respective power signals 47 may have some relative phase difference. In this aspect, since the phase difference of the power signals may be measured a priori, the controllers may be particularly adapted to compensate for such a phase difference and thereby still achieve synchronization based on the line frequencies in a manner similar to that discussed above.

Figure 5:
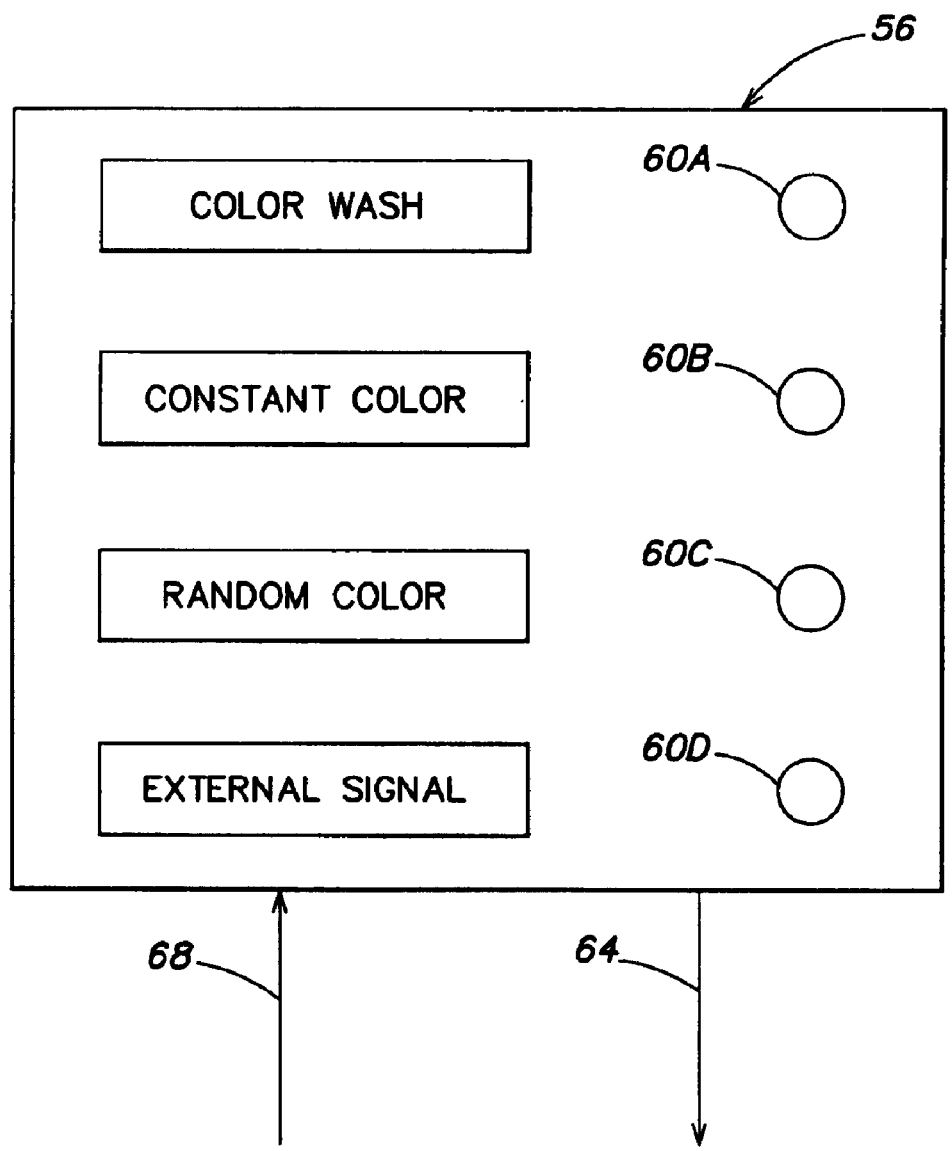
FIG. 5 is a diagram illustrating one example of a remote user interface used in a pool or spa environment such as that shown in FIG. 1, according to one embodiment of the invention.

FIG. 5 illustrates an example of a remote user interface 56 according to one embodiment of the invention. As discussed above in connection with FIGS. 1 and 4, the remote user interface 56 may be used to facilitate control of a single light source or of a number of light sources coupled together to form a networked lighting system. In the embodiment shown in FIG. 5, the remote user interface 56 may include one or more selectors, shown in FIG. 5 as the selectors 60A–60D, to allow a user to remotely control at least one parameter associated with variable color radiation generated by one or more light sources. According to various embodiments of the invention, the selectors 60A–60D may include one or more buttons, adjustable dials, adjustable sliders, adjustable thumb wheels, one or more joy sticks, one or more keypads, touch sensitive pads, switches, and the like.

FIG. 5 also shows that the remote user interface 56 outputs one or more control signals 64 to effect control of one or more light sources. For example, in one aspect of this embodiment, one or more control signals 64 output by the remote user interface 56 may be applied as one or more external signals 46 to a controller 34 associated with a light source 24, as illustrated in FIG. 2. Alternatively, as shown in FIG. 4, the remote user interface 56 may output one or more control signals 64 to the network 48 to control one or more light sources coupled to the network 48, as well as one or more other devices or accessories associated with the pool or spa that may be coupled to the data network 48.

In the particular example of a remote user interface 56 shown in the embodiment of FIG. 5, the remote user interface 56 may be used to select one of three preprogrammed illumination programs, as well as one or more external signals 68 provided as inputs to the remote user interface 56. In one aspect of this embodiment, the exemplary illumination programs entitled "Color Wash," "Constant Color" and "Random Color," indicated on a panel of the remote user interface 56 shown in FIG. 5, each may be programmed in one or more storage devices 38 associated with a particular light source 24, as shown for example in FIG. 2. Upon activation by a user of one of the selectors 60A–60C associated with the respective pre-programmed illumination programs indicated on the remote user interface 56 shown in FIG. 5, one or more control signals 64 is output by the remote user interface 56 and received as one or more external signals 46 at the input 45 of the controller 34 shown in FIG. 2. Upon receiving the one or more external signals 46, the controller 34 selects the appropriate pre-programmed illumination program from the storage device 38 and executes the program, thereby generating one or more control signals 36 to control the light source 24 in a predetermined manner.

According to yet another embodiment, the remote user interface 56 shown in FIG. 5 may be adapted to receive one or more external signals 68 that may be selected by a user via the selector 60D of the remote user interface. In one aspect of this embodiment, one or more external signals 68 may be routed through the remote user interface 56, upon selection by the user of the selector 60D, to be provided in turn as one or more control signals 64 output by the remote user interface 56, without being processed by the remote user interface 56. In another aspect, the remote user interface 56 may provide some processing of the one or more external signals 68 before outputting one or more control signals 64. According to yet another aspect of this embodiment, a variety of external signals 68 may be provided to the remote user interface 56; for example, as discussed above in connection with FIG. 2, with reference to various external signals 46 that may be applied directly to the controller 34, one or more external signals 68 provided to the remote user interface 56 shown in FIG. 5 may include, but are not limited to, an output of one or more sensors adapted to detect one or more environmental conditions in the environment in or around the pool or spa, as discussed further below in connection with FIG. 8.

Figure 6:
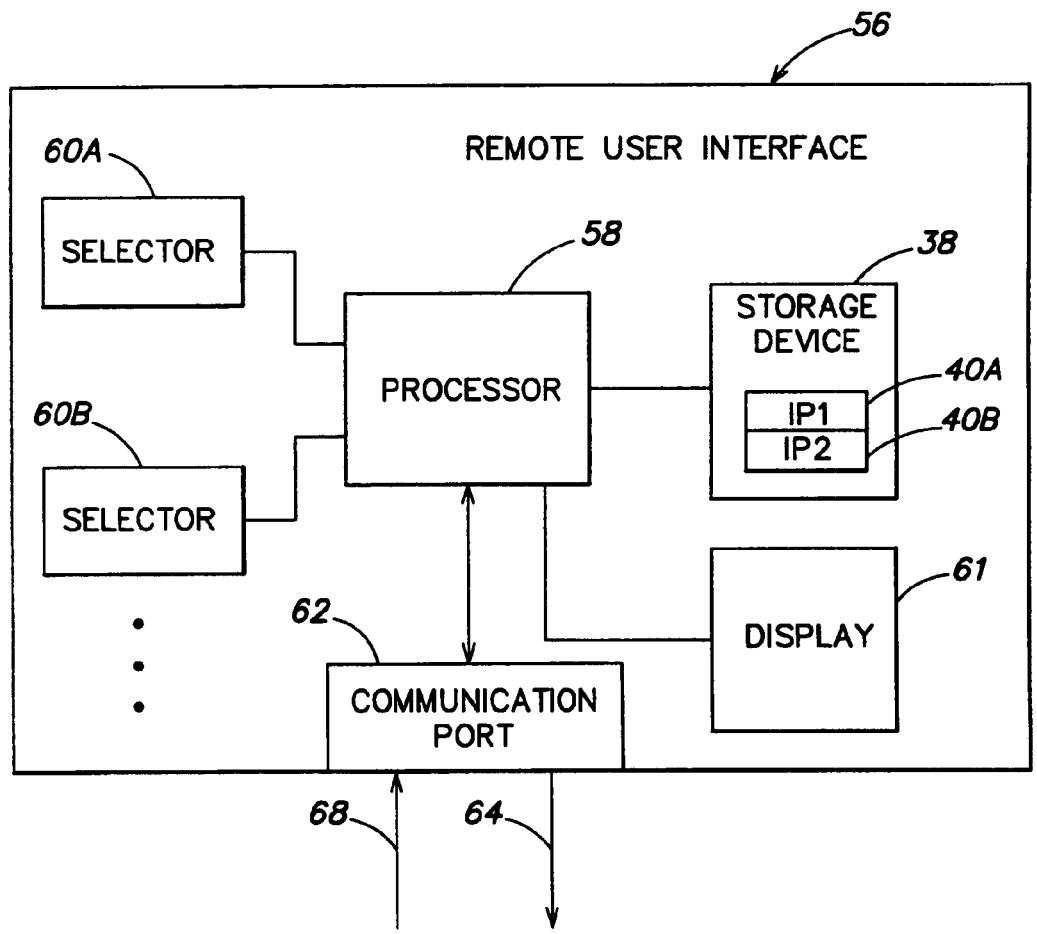
FIG. 6 is a diagram illustrating another example of a remote user interface used in a pool or spa environment such as that shown in FIG. 1, according to one embodiment of the invention.

FIG. 6 is a diagram illustrating another example of a remote user interface 56 according to one embodiment of the invention. As shown in FIG. 6, the remote user interface 56 of this embodiment includes one or more selectors 60A and 60B and one or more processors 58 responsive to operation of the one or more selectors. FIG. 6 also shows that the remote user interface 56 may include one or more storage devices 38, on which are stored one or more illumination programs 40A and 40B, in a manner similar to that described above in connection with FIG. 2. According to one aspect of this embodiment, the one or more selectors 60A and 60B allow the user to remotely select a particular illumination program stored on the storage device 38. According to another aspect of this embodiment, one or more selectors 60A and 60B of the remote user interface 56 may be operated to allow the user to control one or more variable parameters associated with a particular illumination program.

FIG. 6 also shows that the remote user interface 56, according to one embodiment, may include one or more displays 60 coupled to the processor 58, to indicate to the user a status of one or more parameters associated with the radiation generated by one or more light sources being controlled by the remote user interface 56. One example of a display 60 associated with the remote user interface 56 is discussed further below in connection with FIG. 7.

FIG. 6 also shows that the remote user interface 56, according to one embodiment, may include one or more displays 61 coupled to the processor 58, to indicate to the user a status of one or more parameters associated with the radiation generated by one or more light sources being controlled by the remote user interface 56. One example of a display 60 associated with the remote user interface 56 is discussed further below in connection with FIG. 7.

Figure 7:
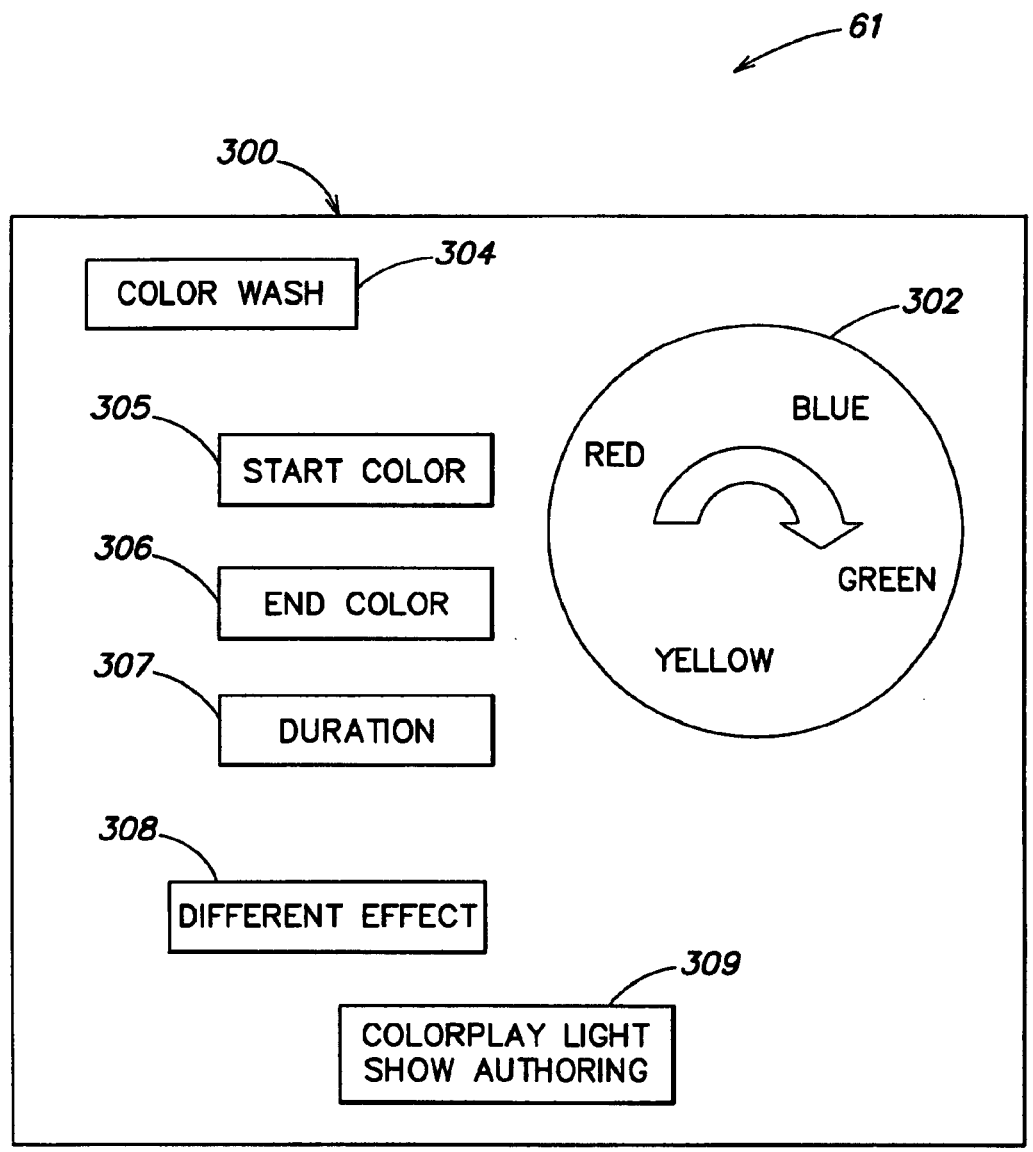
FIG. 7 is a diagram illustrating one example of a display of a remote user interface used in a pool or spa environment such as that shown in FIG. 1, according to one embodiment of the invention.

FIG. 7 is a diagram showing an example of a display 61 associated with the remote user interface 56 shown in FIG. 6, according to one embodiment of the invention. In the embodiment of FIG. 7, the display 61 may include an LCD or plasma screen 300. In one aspect of this embodiment, the display screen 300 may be adapted to include touch-sensitive capabilities so as to simulate one or more selectors, thereby allowing the user to control one or more parameters of the radiation generated by one or more light sources via the display screen 300. For example, in one aspect of this embodiment, the display screen 300 may include a touch-sensitive color wheel 302 to display an illumination spectrum and allow a user to select one or more desired colors for illumination of the liquid 22 in the pool or spa 20 by visual inspection of the color wheel. More specifically, in this aspect, the user may place a finger on the desired color displayed in the color wheel, and the remote user interface 56 would control one or more light sources to produce the selected color.

In yet another aspect of the embodiment of the display 60 shown in FIG. 7, the display screen 300 also may display status information and/or touch-sensitive selectors indicative of one or more variable parameters that are germane to a particular selected illumination program. For example, according to one aspect of this embodiment, upon selection of a pre-programmed illumination program 304 entitled "Color Wash," the display screen 300 may indicate touch-sensitive selectors 305, 306, and 307 to allow a user to vary particular parameters germane to the Color Wash illumination program (e.g., Start Color 305, End Color 306, and Duration 307). One or more of the touch-sensitive selectors 305, 306, and 307 also may work in tandem with the color wheel 302; for example, to vary the indicated parameters of the Color Wash program, the user would first activate one of the selectors 305, 306, and 307 to indicate the desired action, followed by placing a finger on the desired color on the color wheel corresponding to the desired action (e.g., press Start Color then place finger on red in the color wheel, press End Color then place finger on blue in the color wheel, etc.).

As also shown in FIG. 7, according to one embodiment, the display screen 300 may indicate one or more touch-sensitive selectors to allow a user to select a different illumination program ("Different Effect" 308), or to program a custom illumination effect ("Color Play Light Show Authoring" 309). Various methods and apparatus for authoring custom illumination effects via a remote user interface are discussed in detail in U.S. patent application Ser. No. 09/616,214, entitled AUTHORING A LIGHTING SEQUENCE, and U.S. patent application Ser. No. 09/870,418, entitled METHODS AND APPARATUS FOR AUTHORING AND PLAYING BACK LIGHTING SEQUENCES, which applications are incorporated herein by reference.

Figure 8:
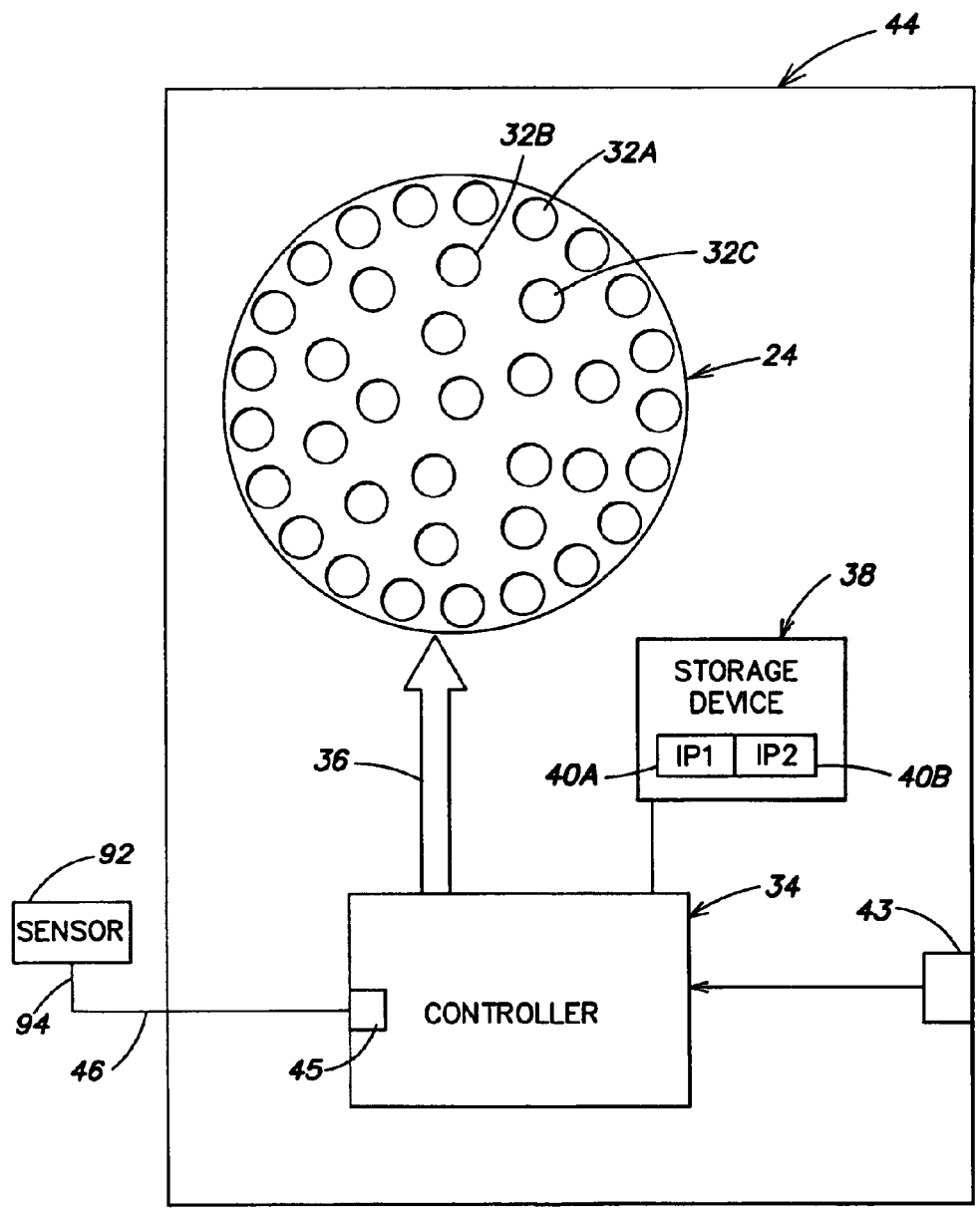
FIG. 8 is a diagram illustrating the use of a sensor to control a light source in a pool or spa environment such as that shown in FIG. 1, according to one embodiment of the invention.

FIG. 8 illustrates yet another embodiment of the present invention, in which one or more light sources 24 supported by a pool or spa 20 such as that shown in FIG. 1 are coupled to one or more sensors 92 that output one or more detection signals 94 in response to one or more detectable conditions. In the embodiment of FIG. 8, the sensor 92 is shown coupled directly to the input 45 of the controller 34, such that one or more detection signals 94 provide one or more external signals 46 to the controller 34. It should be appreciated, however, that the invention is not limited in this respect, as one or more sensors 92 may be coupled to one or more controllers associated with one or more light sources in the pool or spa environment, and alternatively may be coupled to a network 48 serving a networked lighting system 42 in the pool or spa environment, as discussed above in connection with FIG. 4, and further below in connection with FIG. 9.

According to one embodiment, the sensor 92 shown in FIG. 8 responds to one or more environmental conditions, as discussed, for example, in U.S. application Ser. No. 09/213,607, entitled SYSTEMS AND METHODS FOR SENSOR-RESPONSIVE ILLUMINATION, which application is incorporated herein by reference. In one aspect of this embodiment, the sensor 92 varies one or more detection signals 94 based on changes in the detected environmental condition. Some examples of environmental conditions that may be detected by the sensor 92 include an illumination condition (for which the sensor 92 may be a light sensor), a temperature (for which the sensor 92 may be a temperature sensor), a force (for which the sensor 92 may be a force transducer), and sound waves (for which the sensor 92 may be a pressure transducer, such as a microphone or piezoelectric device). Other examples of detectable environmental conditions may be related to one or more weather conditions such as atmospheric pressure (for which the sensor 92 may be a barometer), and ambient humidity (for which the sensor 92 may be a humidity sensor). Similarly, yet another example of a detectable environmental condition includes a presence of electromagnetic radiation within a particular band of wavelengths. In this case, the sensor 92 may be adapted to output one or more detection signals 94 in response to the presence of the electromagnetic radiation within the particular band of wavelengths. Yet other examples of detectable environmental conditions include a motion (for which the sensor 92 may be a motion sensor), or a presence of one or more thermal bodies (for which the sensor 92 may be a thermal or infrared detector).

According to another aspect of the embodiment shown in FIG. 8, one or more detectable conditions monitored by the sensor 92 may include one or more liquid conditions of the liquid 22 in the pool or spa 20 shown in FIG. 1. In one aspect, the sensor 92 varies one or more detection signals 94 based on changes in one or more liquid conditions monitored by the sensor 92. For example, the sensor 92 may be adapted to monitor various liquid conditions including, but not limited to, a temperature of the liquid, and/or a concentration of one or more substances in the liquid, such as a salt concentration in the liquid, a chlorine concentration in the liquid, or a bacteria level in the liquid.

In this aspect, the controller 34 may be adapted to control the light source 24 based on the monitored liquid condition. For example, the controller 24 may control the light source 24 to output a first color when the temperature of the liquid is below a predetermined range, and change the first color to a second color when the temperature of the liquid falls within the predetermined range. In this respect, one embodiment of the invention is directed to indicating a "readiness" of the liquid 22 in the pool or spa 20, via the radiation generated by one or more light sources 24, based on one or more desirable conditions of the liquid 22. More specifically, in one aspect of this embodiment, the controller 34 may control the light source 24 to generate a predetermined illumination condition that will indicate to a user when one or more conditions of the liquid (e.g., temperature, salt concentration, chlorine concentration, bacteria levels, etc.) fall within a predetermined desired range.

According to yet another aspect of the embodiment shown in FIG. 8, one or more detectable conditions monitored by the sensor 92 may include one or more operating conditions of the light source 24, wherein the sensor 92 is adapted to vary one or more detection signals 94 based on changes in one or more operating conditions of the light source 24. For example, in one aspect of this embodiment, the sensor 92 may monitor a temperature of the light source 24. In yet another aspect, the sensor 92 may monitor an electrical current to the light source 24 (e.g., provided by one or more control signals 36 output by the controller 34). In response to one or more detection signals representing one or more operating conditions of the light source 24 (received as one or more external signals 46), the controller 34, according to one embodiment, may control the radiation output by the light source 24 so as to maintain safe operation of the light source 24. For example, in one aspect of this embodiment, the controller 34 controls the radiation output by the light source 24 so as to maintain one or more operating conditions of the light source 24 within a predetermined "safe" range (e.g., a predetermined temperature range, a predetermined range of electrical currents, etc.). In yet another aspect, the controller 34 may control the radiation output by the light source 24 so as to provide one or more indications to a user, via the radiation output, if the one or more operating conditions monitored by the sensor 92 do not fall within a predetermined range (e.g., the controller may control the light source 24 to flash a particular color repeatedly so as to indicate an unsafe operating condition of the light source 24).

Figure 9:
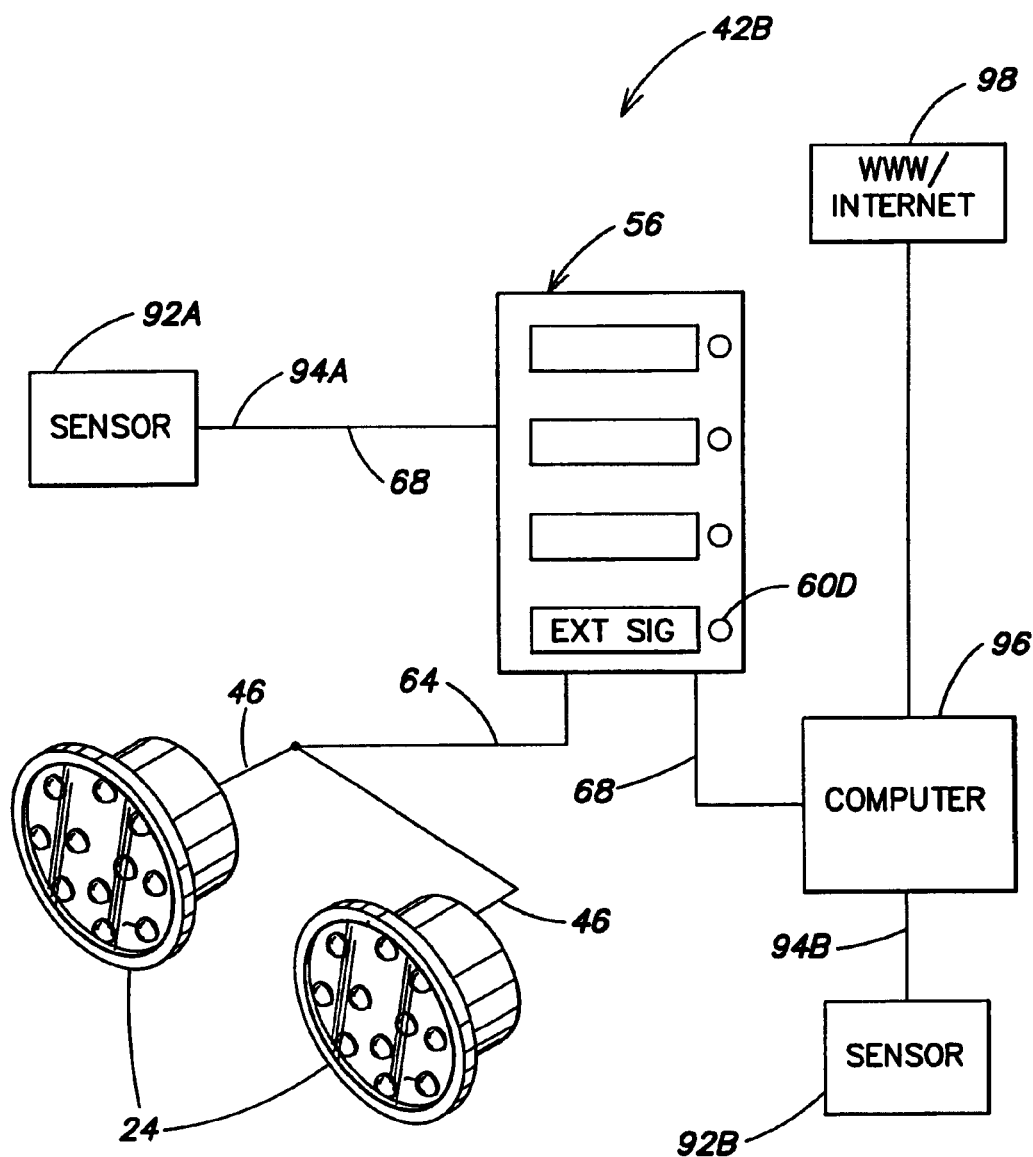
FIG. 9 is a diagram illustrating the use of one or more sensors to control one or more light sources in a networked lighting system for a pool or spa environment such as that shown in FIG. 1, according to one embodiment of the invention.

FIG. 9 is a diagram illustrating another embodiment of the invention, in which one or more light sources 24 are coupled to one or more sensors 92A and 92B to form a networked lighting system 42B. While many of the concepts underlying the network lighting system 42B are similar to those discussed above in connection with FIG. 4, FIG. 9 shows that one or more sensors 92A and 92B may be coupled to the network lighting system 42B in a variety of manners to provide one or more detection signals used to control one or more light sources 24. For example, FIG. 9 shows that a first sensor 92A is coupled to the remote user interface 56. In one aspect of this embodiment, the remote user interface 56 may be similar to that shown in FIG. 5, and include at least one selector 60D to allow a user to select an external signal provided to the remote user interface 56. In this regard, one or more detection signals 94A may be provided as external signals 68 to the remote user interface 56.

Alternatively, according to another aspect of the embodiment illustrated in FIG. 9, a second sensor 92B may be coupled to a computer 96, which, in turn, provides one or more external signals 68 to the remote user interface 56. In turn, the remote user interface 56 provides one or more control signals 64 to one or more light sources 24, based on detection signals received from one or more sensors, either directly or via the computer 96. Additionally, according to another aspect of this embodiment (as also shown in FIG. 4), the remote user interface 56, via the computer 96 shown in FIG. 9, may be coupled to the Internet 98 such that one or more control signals 64 provided to one or more light sources 24 are derived from information obtained on the Internet. It should be appreciated that a wide variety of configurations are possible in a networked lighting system for the illumination of liquids, according to various embodiments of the invention, and that such configurations are not limited to the specific examples discussed above.

Figure 10:
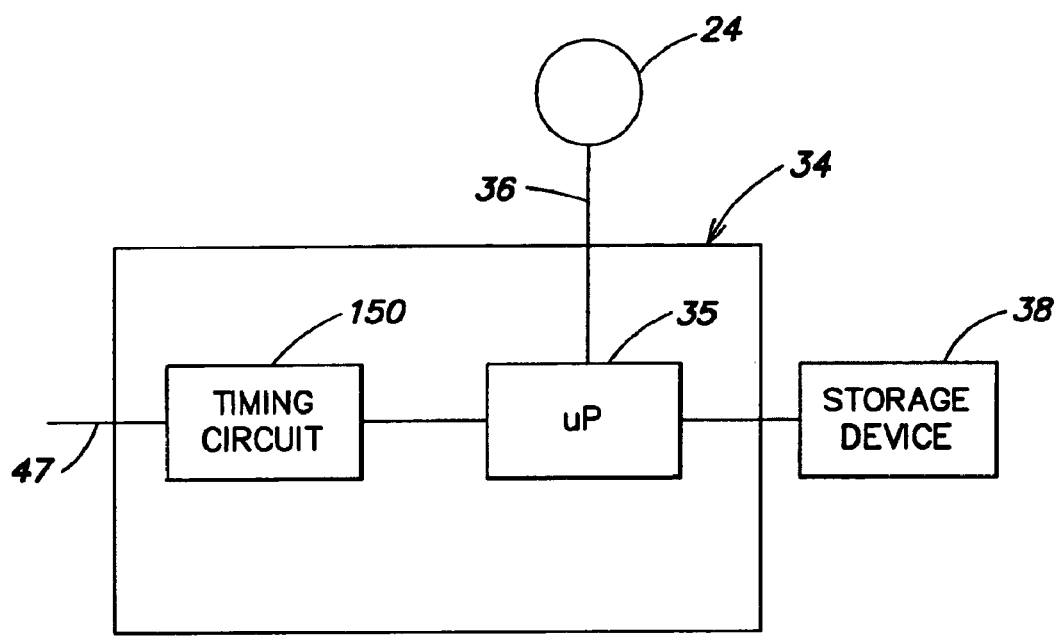
FIG. 10 is a diagram of a controller that facilitates control of a light source based on one or more interruptions of power, according to one embodiment of the invention.

FIG. 10 is a diagram illustrating a controller 34 according to one embodiment of the invention that facilitates control of one or more light sources 24 supported by a pool or spa 20 such as that shown in FIG. 1, via one or more interruptions in the power signal 47 supplied to the controller 34. In one aspect of this embodiment, the feature of controlling one or more light sources via interruptions in power may provide an alternative solution for remotely controlling illumination conditions in a liquid illumination environment, by simply toggling a power switch to one or more controllers associated with the light source(s). Hence, according to one aspect of this embodiment, other types of local or remote user interfaces may be unnecessary, thereby facilitating in some cases the retrofitting of novel multi-color controllable light sources into existing pool or spa lighting systems. It should also be appreciated that power interruption control techniques for light sources are not necessarily limited to the pool or spa environment, and may have applicability in other lighting control applications as well.

According to one aspect of this embodiment, with reference to FIG. 10, the controller 34 may be adapted to control the light source 24 based on one or more interruptions in the power signal 47 supplied to the controller 34. In this sense, the controller 34 processes the power signal 47 such that the power signal 47 serves as an external control signal, in a manner similar to that of one or more external signals 46 provided at the input 45 to the controller, as discussed above in connection with FIG. 2.

In another aspect of this embodiment, the controller 34 may be adapted to control the light source 24 based on one or more interruptions in the power signal 47 having an interruption duration that is less than or equal to a predetermined duration. In yet another aspect of this embodiment, if the interruption duration of an interruption in the power signal 47 is greater than the predetermined duration, the controller 34 does not effect any changes in the radiation output by the light source 24.

In particular, according to one embodiment as illustrated in FIG. 10, the controller 34 may include a timing circuit 150 to receive as an input the power signal 47. In one aspect, the controller 34 also may include one or more microprocessors 35, coupled to the timing circuit 150, to provide one or more control signals 36 to the light source 24 based on the monitored power signal 47. In another aspect, the timing circuit 150 may include an RC circuit (not shown explicitly in FIG. 10) having one or more capacitors that maintain a charge based on the application of the power signal 47 to the timing circuit 150. In this aspect, a time constant of the RC circuit may be particularly selected based on a desired predetermined duration of an interruption in the power signal 47 that causes the controller 34 (e.g., via the microprocessor 35) to effect some change in the radiation output by the light source 24.

For example, according to one aspect of this embodiment, the controller may be adapted to modify one or more variable parameters of one or more illumination programs based on one interruptions in the power signal 47 having less than or equal to the predetermined duration. Alternatively, in another aspect of this embodiment, if a number of illumination programs are stored in a storage device 38 coupled to the controller 34, the controller 34 may be adapted to select and execute a particular illumination program based on one or more interruptions in the power signal 47 having less than or equal to the predetermined duration.

More specifically, in one aspect of this embodiment, the controller 34 may be adapted to select and execute different illumination programs stored in the storage device 38 based on successive interruptions in the power signal 47. In this aspect, each illumination program stored in the storage device may be associated with one identifier in a sequence of identifiers (e.g., program 1, program 2, program 3, etc.). The controller 34 may be adapted to sequentially select and execute a different illumination program, based on the sequence of identifiers assigned to the programs, by toggling through the different illumination programs with each successive interruption of the power signal 47 having a duration of less than or equal to the predetermined duration. Furthermore, according to another aspect of this embodiment, if an interruption in the power signal is greater than the predetermined duration, the controller 34 may be adapted not to select and execute a different illumination program, but rather execute the last illumination program selected before the interruption in the power signal that was greater than the predetermined duration (i.e., the illumination program selection will not change on a power-up following interruption in the power signal of a significant duration).

More specifically, in the embodiment shown in FIG. 10, upon power-up, the microprocessor 35 periodically monitors the timing circuit 150. In one aspect of this embodiment, if the microprocessor 35 detects a logic high value output by the timing circuit 150 (i.e., the most recent interruption in the power signal 47 was less than the predetermined duration, such that an RC circuit of the timing circuit 150 remained "charged-up"), the microprocessor 35 selects a new illumination program from the storage device 38. However, if the microprocessor 35 detects a logic low value output by the timing circuit 150 (i.e., the most recent interruption in the power signal 47 was greater than the predetermined duration, such that an RC circuit of the timing circuit 150 was able to significantly discharge), the microprocessor 35 does not select a new illumination program, but rather begins to execute the illumination program that was selected prior to the most recent interruption in the power signal 47.

Another embodiment of the present invention is directed to a method of indicating to a user, via the color radiation generated by one or more light sources, that a particular illumination program of a number of illumination programs has been selected. For example, with reference again to FIG. 2, one or more storage devices 38 associated with a controller 34 that controls radiation generated by the light source 24 may store a number of illumination programs (illustrated for example in FIG. 2 as the illumination programs 40A and 40B). As discussed above in connection with FIG. 10, according to one embodiment of the invention, successive interruptions of the power signal 47 provided to the controller 34 may be used to toggle through the illumination programs stored on the storage device 38, so as to select and execute a particular illumination program. Additionally, as discussed above in connection with FIGS. 5–7, a remote user interface 56 may be used to select a particular illumination program from a number of such programs stored on the storage device 38.

In some cases, as a user toggles through multiple illumination programs in order to select a particular illumination program, it may not be immediately apparent to the user which illumination program is selected at any given time. For example, a particular illumination program may be designed such that, when executed, the radiation output from one or more light sources is gradually varied at some predetermined rate to transition between a number of different colors in succession throughout the visible spectrum. An example of such an illumination program is a "color wash" program, as discussed above, which more generally may be referred to as a "dynamic color variation program" having a color variation speed. The color variation speed of such a dynamic color variation program may be either a predetermined or variable parameter of the program. For example, in one case, the color variation speed of the "color wash" illumination program may be predetermined such that the radiation generated by one or more light sources slowly varies in color upon execution of the program to create a soothing varying color illumination effect.

In the current example, it should be appreciated that if a user toggles through a number of illumination programs, including the "color wash" program, the user may not immediately realize that they have selected a dynamic color variation program, such as a color wash program with a slow color variation speed, if they are quickly toggling through the programs. Accordingly, in one embodiment of the invention, one or more variable parameters of a particular illumination program are temporarily modified so as to indicate to the user that the particular illumination program has been selected.

For example, in one aspect of this embodiment, a color variation speed of a dynamic color variation program, such as the "color wash" program, may be temporarily increased upon selection and initial execution of the program to indicate to the user that the program has been selected. In this manner, as a user toggles through a number of illumination programs including dynamic color variation programs, the user is able to more readily realize the selection of such a dynamic color variation program. In the case described above in connection with the color wash program, in one aspect of this embodiment, upon selection of the color wash program, a color of the radiation generated by one or more light sources is rapidly changed for a short period of time upon selection of the program (e.g. 1 to 10 seconds), after which the color variation speed may be automatically decreased to the intended programmed speed (e.g., some nominal color variation speed so as to produce a soothing gradual dynamic color effect).

In the foregoing embodiment, it should be appreciated that a method of indicating to a user the selection of a particular illumination program, via variable color radiation output by one or more light sources, may be used in connection with any of a variety of a dynamic color variation programs including, but not limited, the color wash program described above. Additionally, it should be appreciated that according to other embodiments, the color variation speed of a dynamic color variation program need not be changed, but rather any pattern of radiation may be used (e.g., fast flickering of one or more particular colors) to signify the selection of a particular program.

Another embodiment of the invention is directed to generating variable color radiation in a liquid medium to compensate for various radiation absorption and/or scattering effects due to the liquid medium. In this regard, Applicants have recognized and appreciated that many common liquids, such as water, significantly absorb and/or scatter red color, such that it is more difficult for an observer to detect a presence of red color in the liquid than in air, for example. Additionally, Applicants have recognized and appreciated that in some common pool or spa environments, in which the walls and/or floor of a pool or spa may be constructed with a vinyl lining (in some cases having a bluish color), red color also may be significantly absorbed and/or scattered by the vinyl lining. As an illustrative guideline, a red color in water may decrease in intensity to an observer by as much as approximately 25% or more over a propagation distance of one meter, whereas a green color in water may decrease in intensity by approximately 4% over the same distance. Similarly, a blue color in water may decrease in intensity by only approximately 2% over the same distance.

In view of the foregoing, one embodiment of the invention is directed to a method for generating "liquid hues" to illuminate a liquid, such that when viewed in the liquid by an observer, the liquid hues approximate similar hues observed in non-liquid mediums (e.g., air). More specifically, in one aspect of this embodiment, liquid hues that include radiation having a red color in combination with one or more other colors are generated to approximate a similar hue in a non-liquid medium by increasing the amount of red color included in the liquid hue, to compensate for the absorption and/or scattering of the red color in the liquid medium.

As discussed above, one or more dynamic color illumination programs may be executed in a pool or spa environment to realize a variety of illumination effects. Another embodiment of the invention is directed to methods for dynamic color illumination of a liquid medium that take into consideration the various absorption and scattering effects also discussed above. In particular, in one embodiment of the invention, red color appearing alone is omitted from a dynamic variable color illumination program, due to significant absorption and/or scattering of the red color by the illuminated liquid, so as to prevent the appearance of a lapse or break (i.e., absence of illumination) in the illumination program. For example, according to one embodiment, in the "color wash" illumination program discussed above, red color appearing alone is omitted from the color wash program because, relative to other colors radiated in the liquid, an observer would essentially see little or no hue at all in the liquid if red color alone was radiated into the liquid. It should be appreciated, however, that in one aspect of this embodiment, red color radiation may nonetheless be generated in combination with radiation of one or more other colors to produce a variety of liquid hues, as discussed above.

Figure 11:
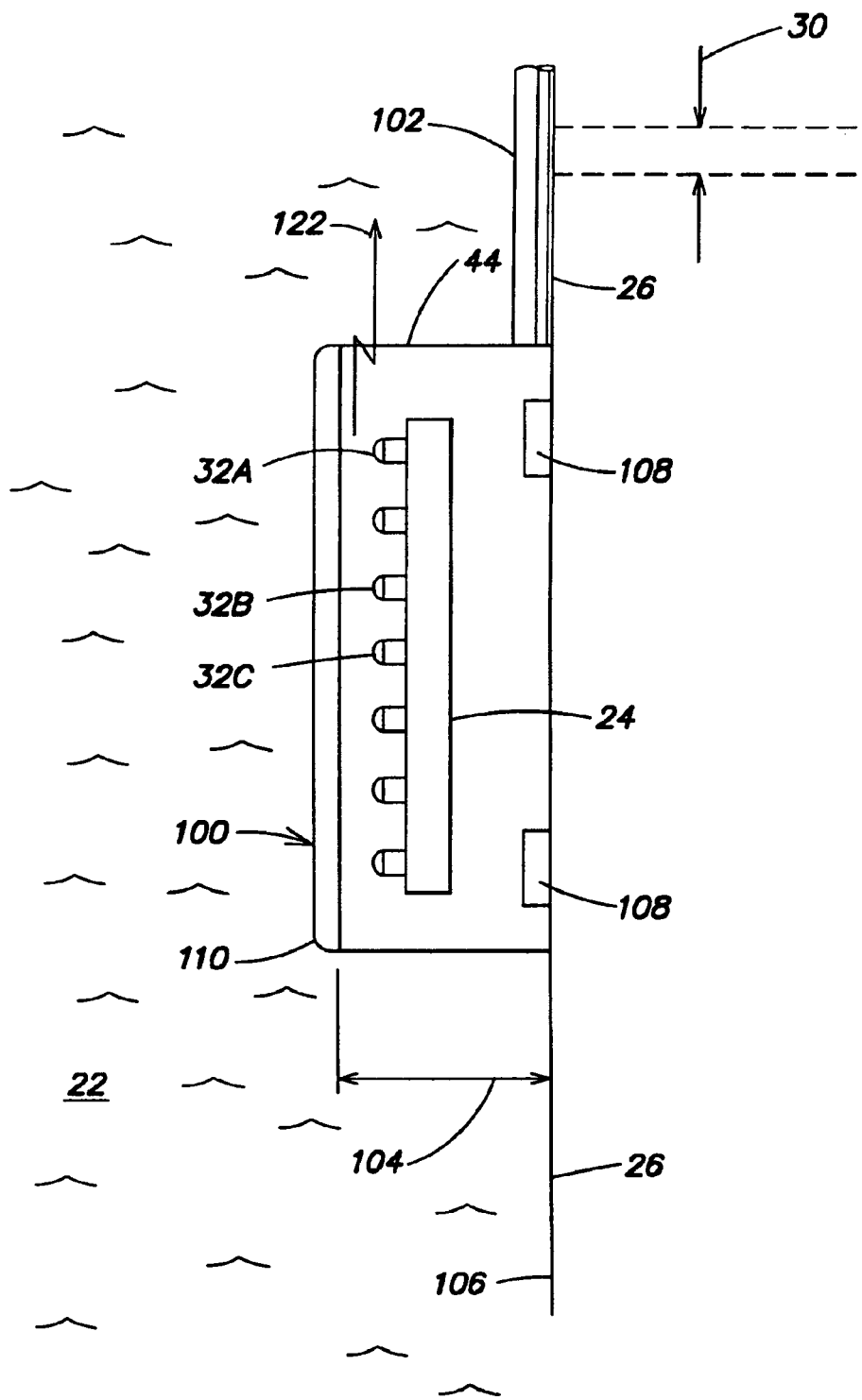
FIG. 11 is a diagram illustrating a lighting fixture, having a particular depth dimension, that may be mounted on a wall or in a niche of a pool or spa, according to one embodiment of the invention.

FIG. 11 is a diagram illustrating another embodiment of the invention directed to a surface mount lighting fixture that may be employed, for example, in a pool or spa environment such as that shown in FIG. 1 to illuminate the liquid 22. In FIG. 11, a lighting fixture 100 including a light source 24 is adapted to be mounted on a surface 106 (e.g., the wall 26 of a pool or spa), and has a first dimension 104 that is essentially normal to the surface 106 when the lighting fixture 100 is mounted on the surface. In one aspect of this embodiment, the first dimension 104 preferably is less than approximately 2.5 inches. In yet other aspects, the first dimension 104 is preferably less than 2.25 inches, more preferably less than 2.0 inches, more preferably less than 1.75 inches, more preferably less than 1.5 inches, more preferably less than 1.25 inches, more preferably less than 1.0 inch, and still more preferably as little as approximately 0.5 inches. In another aspect, the thin "depth" dimension 104 of the lighting fixture 100 shown in FIG. 11 renders the fixture particularly suited for use in "niche-less" lighting applications for pool or spa environments, in which one or more lighting fixtures are mounted directly on an inner surface of a pool or spa wall, rather than being recessed in a "niche" in a pool or spa wall. However, it should be appreciated that the invention is not limited in this respect, as the lighting fixture 100 alternatively may be supported in a niche of the pool or spa.

In one aspect of this embodiment, the lighting fixture 100 of FIG. 11 includes one or more mounting mechanisms 108 to mount the lighting fixture 100 to the surface 106. Examples of mounting mechanisms 108 suitable for purposes of the invention include, but are not limited to, one or more suction mechanisms or one or more magnetic mechanisms to mount the lighting fixture 100 to the surface 106. In another aspect, as discussed above in connection with various figures, the light source 24 shown in the fixture of FIG. 11 may include one or more LEDs, and may further include two or more differently colored LEDs 32A–32C (e.g., red, green and blue LEDs).

In yet another aspect, the lighting fixture 100 shown in FIG. 11 also may include an essentially water tight lens 110 to prevent the light source 24 from contacting the liquid 22. In this regard, the lighting fixture 100 also may be particularly adapted to be submersible in the liquid by including an essentially water tight housing 44, such that the lighting fixture 100 may be disposed below the range 30 of typical liquid levels in the pool or spa.

As also shown in the embodiment of FIG. 11, in one aspect the lighting fixture 100 is mounted on the inner surface 106 of a wall 26 of a pool or spa such that the lighting fixture does not protrude through the wall 26. In another aspect, a cable 102 may be coupled to the lighting fixture 100 and mounted to the inner surface 106 of the wall 26 such that no holes are required to be made through the wall 26 below the range 30 of typical liquid levels. Alternatively, in yet another aspect, a small hole may be made through the wall 26 in a portion of the wall on which the lighting fixture 100 is mounted, to accommodate the cable 102 passing through the wall 26. In this aspect, the lighting fixture 100 (and, more particularly, the one or more mounting mechanisms 108) may be adapted to make a water tight seal with the inner surface 106, such that the liquid 22 is unable to leak through the hole.

Figure 12:
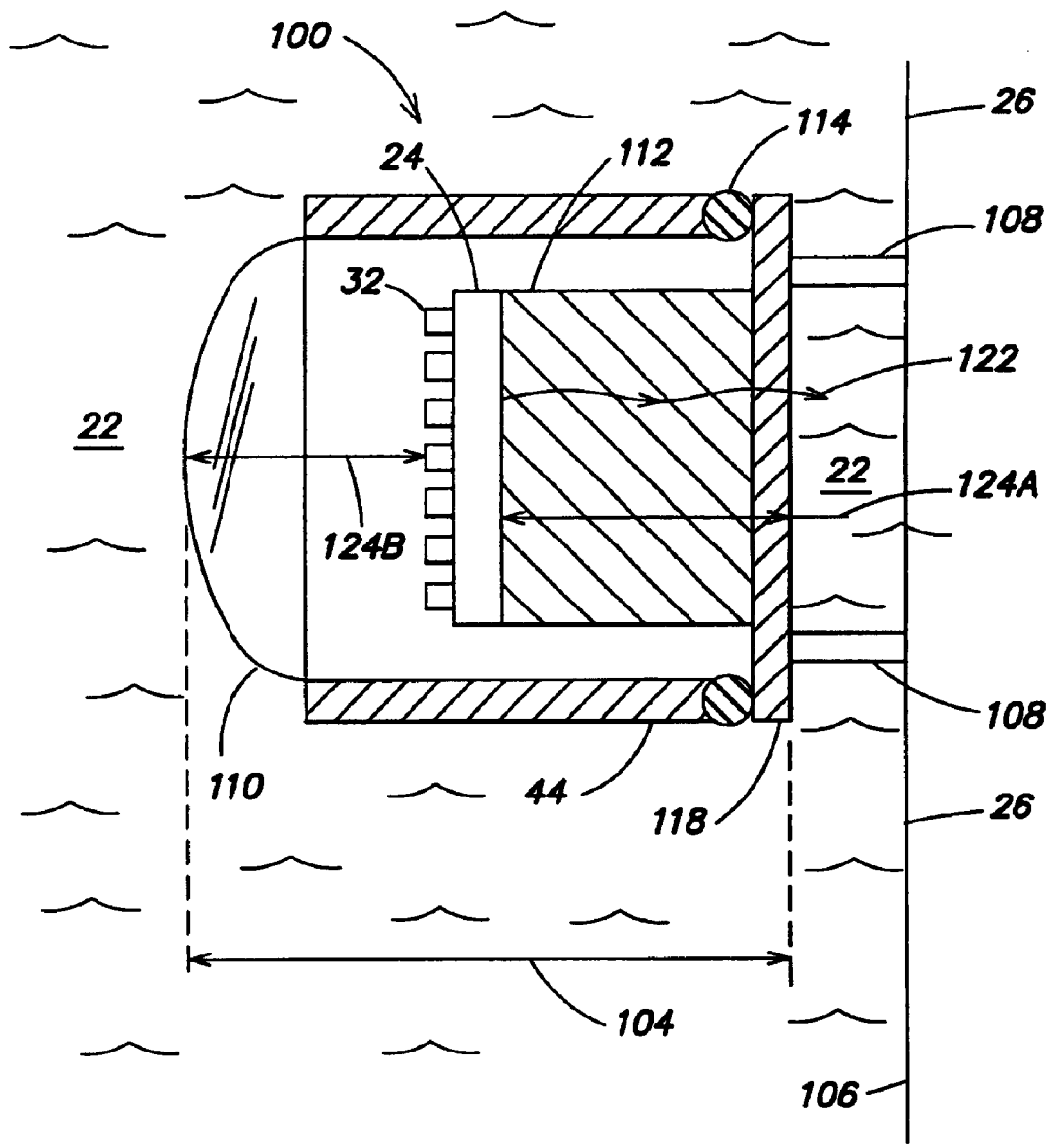
FIG. 12 is a diagram illustrating a lighting fixture for illumination of liquids that is adapted to effectively dissipate heat into a liquid in contact with the lighting fixture, according to one embodiment of the invention.

FIG. 12 is a diagram illustrating another example of a lighting fixture 100 according to one embodiment of the present invention. In the embodiment of FIG. 12, the lighting fixture 100 is coupled to the wall 26 of the pool or spa by one or more "stand-off" mounting mechanisms 108, which allow the liquid 22 to essentially surround the lighting fixture 100. While the lighting fixture 100 in FIG. 12 is shown mounted to a surface 106 of the wall 26 of the pool or spa, it should be appreciated that, like the fixture shown in FIG. 11, the lighting fixture of FIG. 12 may be mounted in a niche in the wall 26 of the pool or spa adapted to support the lighting fixture.

Similar to the lighting fixture 100 shown in FIG. 11, according to one embodiment the lighting fixture 100 shown in FIG. 12 includes a housing 44 and a lens 110. Additionally, in one aspect, the housing contains a light source 24 that may include one or more LEDs 32. In another aspect of the embodiment of FIG. 12, the light source 24 may be mounted on a thermally conductive electrically resistive gap pad 112, which is in turn attached to a back plate 118 of the housing 44. As shown in FIG. 12, the sides of the housing 44 are coupled to the back plate 118 via a rubber seal 114.

The gap pad 112 shown in FIG. 12 allows heat generated from the light source 24 (and any electronics associated with the light source 24) to flow to the back plate 118 of the housing 44, while preventing electrical contact between the light source 24 and the back plate. In one aspect of this embodiment, the back plate 118 may be a metal plate to facilitate the conduction of heat from the light source 24 through the gap pad 112 and into the liquid 22 in contact with the back plate 118. In other embodiments, the back plate 118 alternatively may be formed from a plastic or rubber material.

In the embodiment of FIG. 12, although a gap pad 112 is provided to facilitate thermal conduction, it should be appreciated that the gap pad 112 may not be required according to other embodiments. In particular, Applicants have recognized and appreciated that because the lighting fixture 100 shown in FIG. 12 is in substantial contact with the liquid 22, the liquid 22 may serve as a significant absorber of heat such that heat generated by the light source or associated electronics is effectively absorbed by the liquid 22 via the housing 44. In this respect, one embodiment of the invention is directed more generally to a light fixture in a liquid illumination environment, wherein the light source 24 of the fixture is particularly positioned in the housing 44 such that heat generated by the light source is effectively absorbed by the liquid 22 in contact with the housing 44.

In yet another embodiment, the gap pad 112 shown in FIG. 12 may be replaced by another standoff (not shown in FIG. 12), such that the light source 24 is spaced from, but nonetheless attached to, the back plate 118 (or otherwise attached to the housing 44). In one aspect of this embodiment, space within the housing between the light source 24 and the housing 44 (or the back plate 118) may provide sufficient electrical isolation while nonetheless allowing an adequate transfer of heat from the light source 24 through the housing and into the liquid 22. This concept is further illustrated in the light fixture shown in FIG. 11, in which the thermal path 122 is illustrated from the light source 24 out through a side of the housing 44 into the liquid 22.

Another embodiment of the present invention is directed to a light source comprising one or more LEDs and an interface coupled to the one or more LEDs that is adapted to engage mechanically and electrically with a conventional pool or spa light socket. Examples of light sources including one or more LEDs coupled to various interfaces that are adapted to engage with conventional light sockets are discussed in U.S. Pat. No. 6,016,038, as well as U.S. patent application Ser. No. 09/215,624, entitled SMART LIGHT BULB, which application is incorporated herein by reference.

Figure 13:
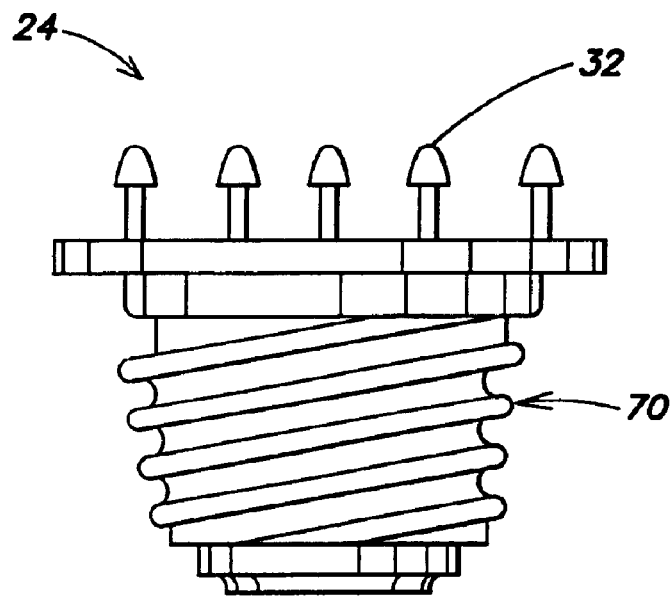
FIG. 13 is a diagram illustrating a light fixture having an interface to engage mechanically and electrically with a conventional screw type pool or spa light socket, according to one embodiment of the invention.

FIG. 13 illustrates one example of this embodiment, showing a light source 24 including one or more LEDs 32 coupled to an interface 70. The interface 70 illustrated in FIG. 13 is adapted to engage mechanically and electrically with a screw type light socket, conventionally associated with Edison-type incandescent light bulbs, that is supported by the pool or spa 20 shown in FIG. 1.

Figure 14:
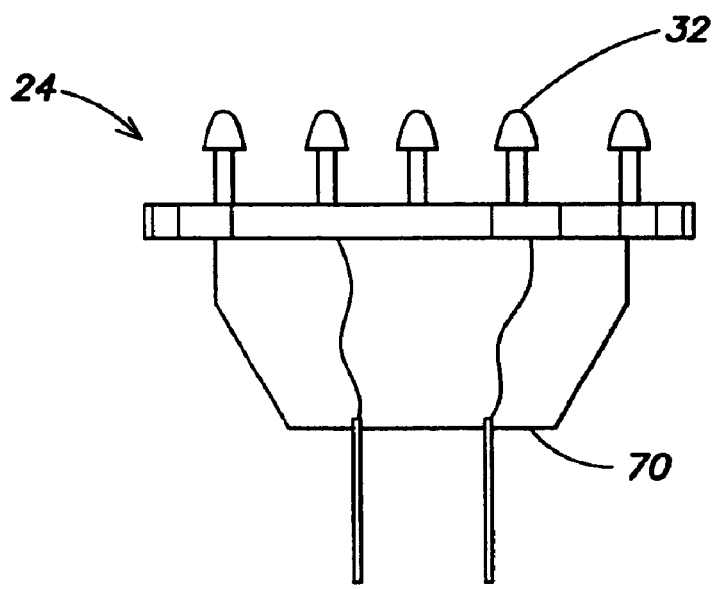
FIG. 14 is a diagram illustrating a light fixture having an interface to engage mechanically and electrically with a conventional multi-pin pool or spa light socket, according to one embodiment of the invention.

FIG. 14 illustrates yet another embodiment of a light source according to the invention, in which the interface 70 is adapted to engage mechanically and electrically with a multi-pin light socket (such as an MR-16 light socket commonly used for halogen light sources) supported by the pool or spa 20 shown in FIG. 1. According to other aspects of this embodiment, the interface 70 may be adapted to engage mechanically and electrically with bayonet-type light sockets, a variety of multi-pin light sockets, fluorescent light sockets, halogen light sockets, double-ended halogen light sockets, and wedge-type light sockets, as well as a number of other types of light sockets conventionally used in pools or spas.

Figure 15:
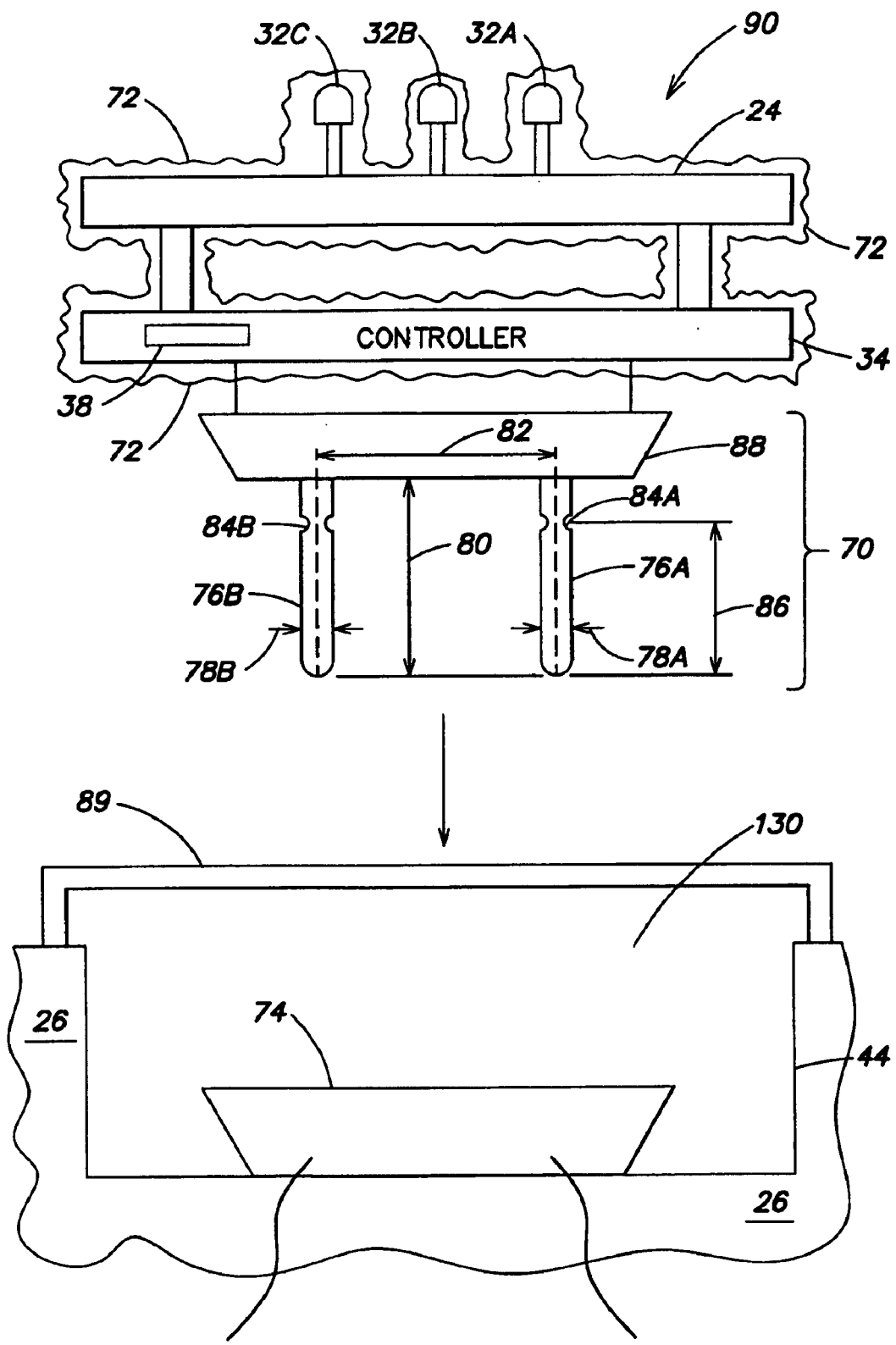
FIG. 15 is a diagram illustrating a light fixture having an interface to engage mechanically and electrically with a conventional wedge type light socket mounted in a niche of a pool or spa, according to one embodiment of the invention.

More specifically, according to one embodiment, a light source 24 including one or more LEDs 32 may be particularly adapted to be supported by a pool or spa by engaging mechanically and electrically with a conventional light socket mounted in a "niche" or indented compartment in a wall 26 of a pool or spa. For example, FIG. 15 illustrates an example of a light fixture 90 adapted to engage mechanically and electrically with a conventional light socket 74 mounted in a niche 130 in a wall 26 of the pool or spa 20, shown in FIG. 1. In one aspect of this embodiment, the niche 130 may serve essentially as a water-tight housing 44 for the light fixture 90, wherein the niche 130 is covered with a water-tight lens or cover 89 once the light fixture 90 is installed in the socket 74. In other embodiments discussed above, the niche 130 alternatively may be allowed to fill with the liquid 22 contained in the pool or spa, and a lighting fixture similar to those illustrated in FIGS. 3, 11 and 12 may be supported by the pool or spa in the niche 130 containing the liquid 22.

Returning to FIG. 15, according to one embodiment, the light fixture 90 includes a light source 24 having one or more LEDs 32A–32C, wherein the light source 24 is coupled to an interface 70 adapted to engage mechanically and electrically with a wedge-type light socket 74 supported by the pool or spa. In one aspect, the light fixture 90 also may include a controller 34 and one or more storage devices 38, as discussed above in connection with FIG. 2.

In another aspect of the embodiment illustrated in FIG. 15, the light source 24 and the controller 34 (or any other circuitry associated with light source 24) may be coated with an encapsulate 72 to protect these components from moisture. In another aspect, the encapsulate may be in contact with the light source 24 and the controller 34 in the form of a conformal coating. In another aspect, the encapsulate may be deposited on the light source and associated circuitry using conventional vacuum deposition techniques. In yet another aspect, the encapsulate may include a potting material in contact with the light source 24 and associated circuitry. In yet another aspect, the encapsulate may be essentially light transmissive. Some examples of encapsulates suitable for purposes of the invention include, but are not limited to, silicones, epoxies, glass resins, polysiloxanes, polyimides, and acrylics. In one embodiment, the encapsulate may be HumiSeal 1B73 aerosol acrylic, available from HumiSeal, Inc., Woodside, N.Y.

As shown in FIG. 15, according to one embodiment, the interface 70 of the light fixture 90 includes two pins 76A and 76B to engage at least electrically with the wedge-type light socket 74. In one aspect of this embodiment, so as to accommodate such engagement, the pins 76A and 76B have respective diameters 78A and 78B of approximately 0.09 inches. In yet another aspect of this embodiment, each of the pins 76A and 76B has a length 80 of approximately 0.46 inches. In yet another aspect of this embodiment, the two pins 76A and 76B are separated from each other by a distance 82 of approximately 0.25 inches.

Figure 16A:
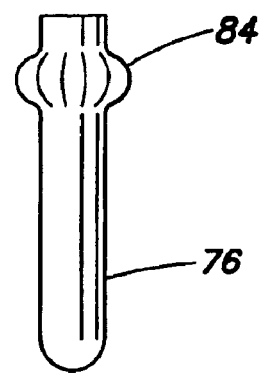
FIG. 16A is a diagram illustrating an example of an interface pin of the light fixture of FIG. 15, according to one embodiment of the invention.

In yet another aspect of the embodiment illustrated in FIG. 15, one or both of the pins 76A and 76B may include one or more perturbations, shown in FIG. 15 as indented grooves 84A and 84B in the pins 76A and 76B, respectively, to facilitate mechanical engagement of the interface 70 and the wedge-type light socket 74. Although the perturbations 84A and 84B are illustrated in FIG. 15 as indented grooves, it should be appreciated that the invention is not limited in this respect, as one or more perturbations in the pins of the interface may include a protruding ring, as shown in FIG. 16A. Additionally, it should be appreciated that one or more perturbations to facilitate mechanical engagement may be formed at least partially around a circumference of a pin or may be formed completely around the circumference of the pin in a continuous fashion. In yet another aspect, as illustrated in FIG. 15 by the perturbation 84A, a perturbation may be located at a distance 86 approximately 0.17 inches from an end of the pin.

In yet another aspect of the embodiment shown in FIG. 15, the interface 70 may include a rubber grommet 88 to further facilitate mechanical engagement of the interface 70 and the wedge-type light socket 74. It should be appreciated that according to other embodiments, the interface 70 shown in FIG. 15 may include the rubber grommet 88 alone or in combination with one or more perturbations in the pins to facilitate mechanical engagement. Similarly, in yet another embodiment, one or more perturbations in the pins provide for adequate mechanical engagement with the socket without the use of the rubber grommet 88.

Figure 16B:
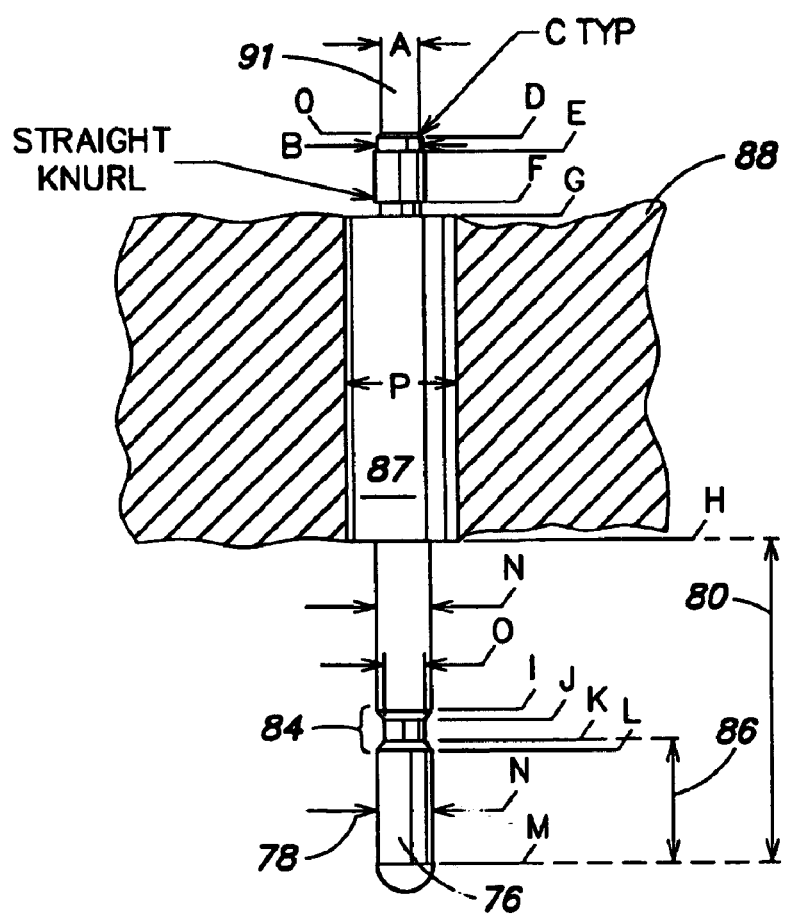
FIG. 16B is a diagram illustrating an example of an interface pin of the light fixture of FIG. 15, according to another embodiment of the invention.

FIG. 16B is a diagram showing a more detailed view of a pin 76 of the light fixture 90 shown in FIG. 16, according to one embodiment of the invention. According to one aspect of this embodiment, exemplary values for various indicated pin dimensions (in inches) are as follows: A=0.059, B=0.067, D=0.005, E=0.020, F=0.100, G=0.115, H=0.588, I=0.836, J=0.848, K=0.878, L=0.891, M=1.046, N=0.090, O=0.065, P=0.158. Also greater detail that the pin 76 may include an indented groove perturbation 84 formed continuously around the pin. FIG. 16B also illustrates that, according to one aspect of this embodiment, the pin 76 may include a widened portion 87 that passes through the rubber grommet 88 and connects to a narrower portion 91 of the pin to which electrical connections may be made.

Figure 17:
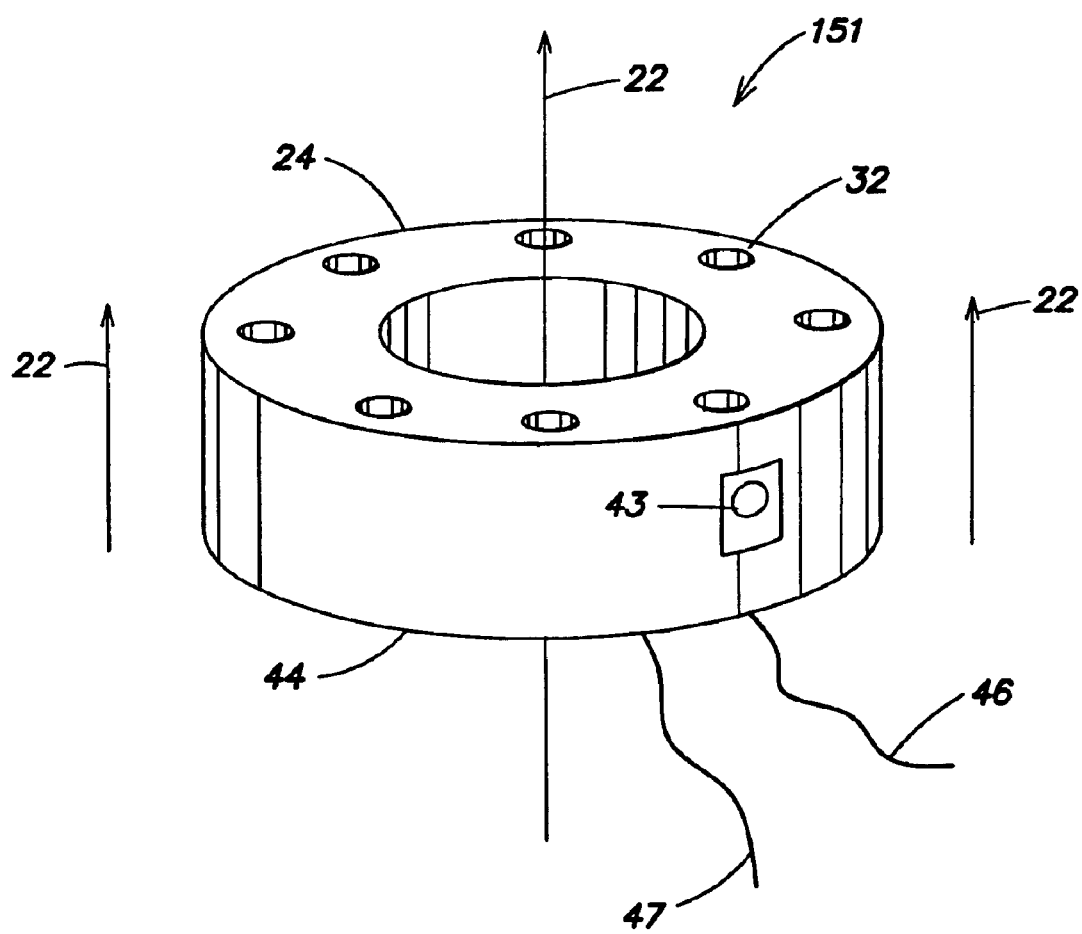
FIG. 17 is a diagram of an apparatus to illuminate a flowing liquid, according to one embodiment of the invention.

FIG. 17 is a diagram showing yet another embodiment of the invention directed to a liquid illumination apparatus 151. In one aspect of this embodiment, the apparatus 150 may include a housing 44 having a variety of ring-like shapes including, but not limited to, circular, triangular, square, octagonal, or any other geometric shape. In the embodiment specifically illustrated in FIG. 17, the housing 44 of the apparatus 150 is shaped essentially as a donut, and is designed to allow the flow of liquid 22 through the center and/or around an outer perimeter of the apparatus 150. Similar to the light sources discussed in the previous figures, the liquid illumination apparatus 150 may include one or more light sources 24, which further may include one or more LEDs 32. In the apparatus 150, radiation generated by the light source 24 is coupled to the flow of the liquid 22 as the liquid passes through and/or around the apparatus 150. In particular, in one aspect of this embodiment, one or more LEDs 32 are arranged to direct radiation into the flow of the liquid 22 to illuminate the liquid. As discussed above in connection with other embodiments, the apparatus 150 may include a local user interface 43, and may be adapted to receive one or more external signals 46 and a power signal 47. Additionally, according to other aspects, the apparatus 150 may include one or more controllers and one or more storage devices, as discussed above in connection with FIG. 2.

Figure 18:
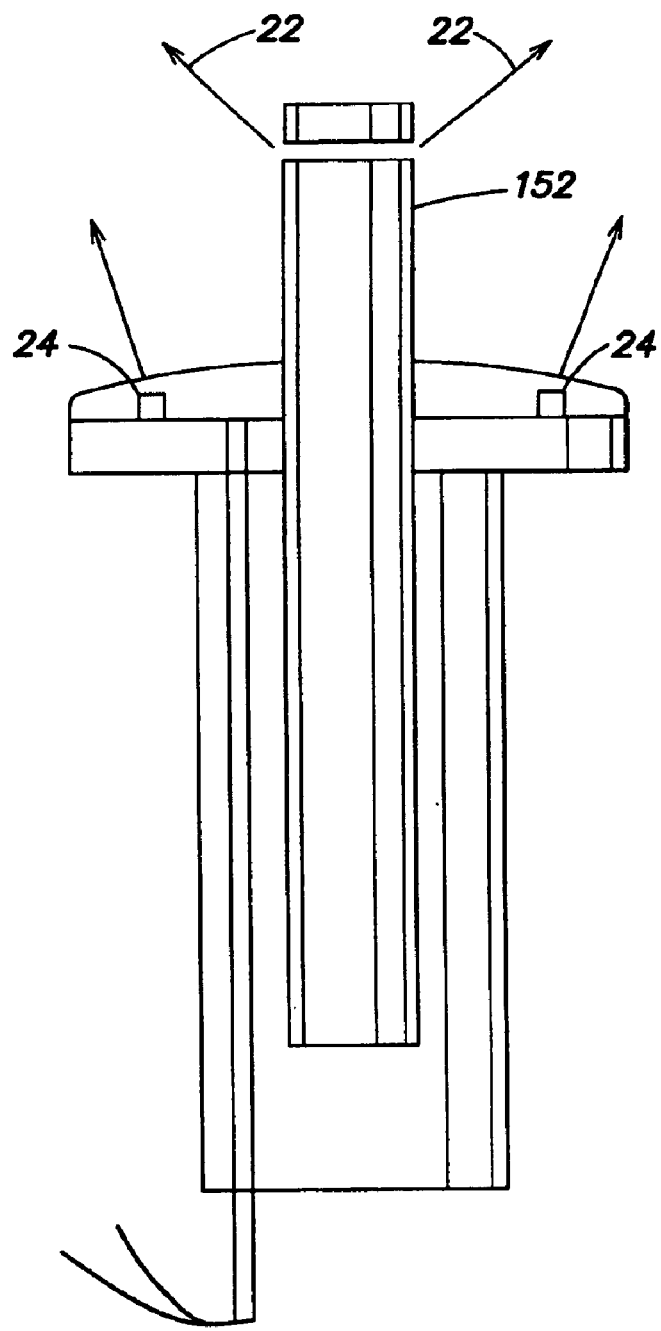
FIG. 18 is a diagram of an apparatus to illuminate a flowing liquid, according to another embodiment of the invention.

FIG. 18 is a diagram illustrating yet another embodiment of a liquid illumination apparatus 152 according to the present invention. In one aspect of this embodiment, the apparatus 152 may be adapted for use as a sprinkler which couples radiation generated by one or more light switches 24 into a stream of liquid 22 emanating from the apparatus 152. In this aspect, the apparatus 152 couples the radiation generated by the light sources 24 with the stream of the liquid 22 to provide colored effects, for example while watering a lawn, or in a decorative setting such as, but not limited to, a pool, spa, or water fountain. While not shown exclusively in FIG. 18, the apparatus 152 similarly may be adapted as the apparatus 151 shown in FIG. 17 to include a local user interface 43. and to receive one or more external signals 46and a power signal 47 for operation of the apparatus 152.

Figure 19:
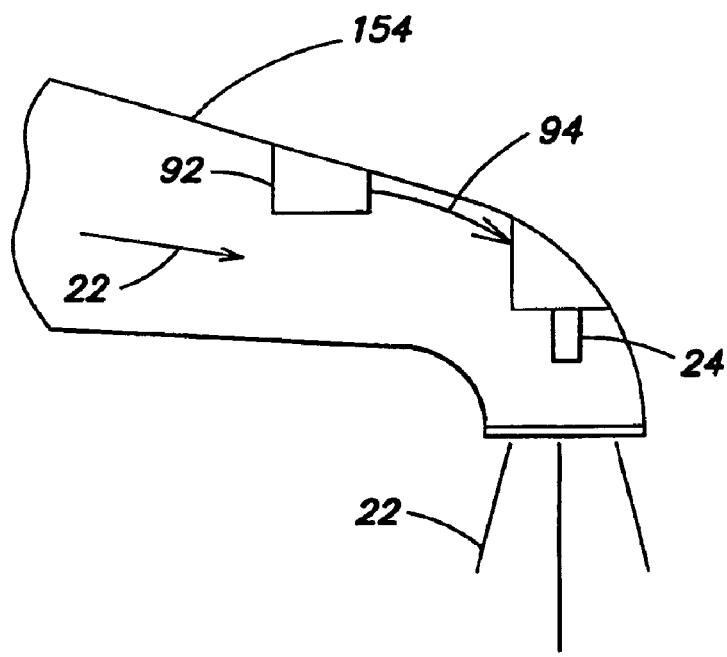
FIG. 19 is a diagram of an apparatus to illuminate a flowing liquid, according to another embodiment of the invention.

FIG. 19 is a diagram illustrating yet another embodiment of the invention directed to a water faucet 154 adapted to illuminate a stream or liquid 22 (e.g., water) with radiation generated by one or more light sources 24 supported by the faucet 154. In one aspect of this embodiment, the light source 24 includes two or more differently colored LEDs, to provide illumination of the stream of liquid 22 with a variety of variable color lighting effects. In one aspect of this embodiment, the light source 24 includes a plurality of red, blue and green LEDs, as discussed above in connection with FIG. 2. In yet another aspect of this embodiment, as discussed above in connection with FIG. 8, the light source 24 supported by the faucet 154 may be responsive to one or more detection signals output by one or more sensors that are employed to monitor one or more conditions related to the stream of liquid 22 exiting the faucet 154. For example, in one embodiment, a temperature of the liquid 22 flowing from the faucet 154 may be monitored by a sensor 92, and an output 94 of the sensor may be employed to control the light source 24, such that the radiation generated by the light source 24 varies with changes in the monitored temperature of the liquid 22.

Figure 20:
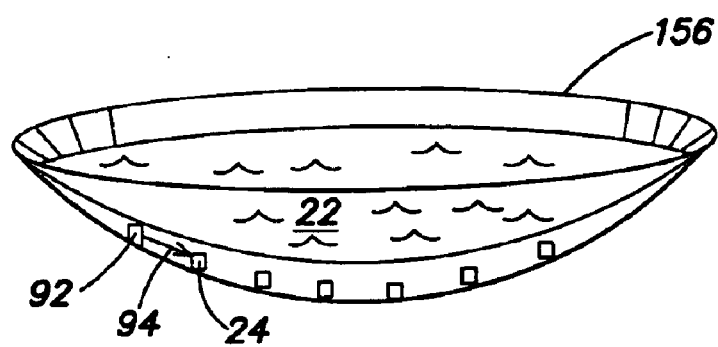
FIG. 20 is a diagram illustrating an illuminated sink or basin, according to one embodiment of the invention.

FIG. 20 illustrates yet another embodiment of the invention directed to illumination of liquids. In the embodiment of FIG. 20, a sink or basin 156 contains a liquid 22 and one or more light sources 24 coupled to the basin. In one aspect of this embodiment, the sink or basin 156 is made of transparent, translucent, semi-transparent, or semi-translucent material, or other materials which allow the transmission or partial transmission of radiation generated by one or more light sources 24 to illuminate a liquid 22 contained in the basin 156. As discussed above in connection with FIG. 19, the sink or basin 156 also may be equipped with a sensor 92 which outputs one or more signals 94 to control one or more light sources 24 as discussed above in connection FIG. 9.

According to yet another embodiment of the invention, a flow of liquid 22, for example as illustrated in FIGS. 17, 18 and 19, may be used to power one or more light sources 24 described in various embodiments herein. Additionally, according to another embodiment, one or more light sources 24 as discussed herein may be powered by other illumination sources, for example sources of solar energy.

In the embodiments of the invention discussed above, various processors and controllers can be implemented in numerous ways, such as with dedicated hardware, or using one or more processors (e.g., microprocessors) that are programmed using software (e.g., microcode) to perform the various functions discussed above. Similarly, storage devices can be implemented in numerous ways, such as, but not limited to, RAM, ROM, PROM, EPROM, EEPROM, CD, DVD, optical disks, floppy disks, magnetic tape, and the like.

For purposes of the present disclosure, the term "LED" refers to any diode or combination of diodes that is capable of receiving an electrical signal and producing a color of light in response to the signal. Thus, the term "LED" as used herein should be understood to include light emitting diodes of all types (including semi-conductor and organic light emitting diodes), semiconductor dies that produce light in response to current, light emitting polymers, electro-luminescent strips, and the like. Furthermore, the term "LED" may refer to a single light emitting device having multiple semiconductor dies that are individually controlled. It should also be understood that the term "LED" does not restrict the package type of an LED; for example, the term "LED" may refer to packaged LEDs, non-packaged LEDs, surface mount LEDs, chip-on-board LEDs, and LEDs of all other configurations. The term "LED" also includes LEDs packaged or associated with other materials (e.g., phosphor, wherein the phosphor may convert radiant energy emitted from the LED to a different wavelength).

Additionally, as used herein, the term "light source" should be understood to include all illumination sources, including, but not limited to, LED-based sources as defined above, incandescent sources (e.g., filament lamps, halogen lamps), pyro-luminescent sources (e.g., flames), candle-luminescent sources (e.g., gas mantles), carbon arc radiation sources, photo-luminescent sources (e.g., gaseous discharge sources), fluorescent sources, phosphorescent sources, high-intensity discharge sources (e.g., sodium vapor, mercury vapor, and metal halide lamps), lasers, electro-luminescent sources, cathode luminescent sources using electronic satiation, galvano-luminescent sources, crystallo-luminescent sources, kine-luminescent sources, thermo-luminescent sources, triboluminescent sources, sonoluminescent sources, radioluminescent sources, and luminescent polymers capable of producing primary colors.

For purposes of the present disclosure, the term "illuminate" should be understood to refer to the production of a frequency (or wavelength) of radiation by an illumination source (e.g., a light source). Furthermore, as used herein, the term "color" should be understood to refer to any frequency (or wavelength) of radiation within a spectrum; namely, "color" refers to frequencies (or wavelengths) not only in the visible spectrum, but also frequencies (or wavelengths) in the infrared, ultraviolet, and other areas of the electromagnetic spectrum. Similarly, for purposes of the present disclosure, the term "hue" refers to a color quality of radiation that is observed by an observer. In this sense, it should be appreciated that an observed hue of radiation may be the result of a combination of generated radiation having different wavelengths (i.e., colors), and may be affected by a medium through which the radiation passes before being observed (due to radiation absorption and/or scattering effects in the medium).

For purposes of the present disclosure, the term "pool" is used generally to describe a vessel containing a liquid (e.g., water), that may be used for any number of utilitarian, entertainment, recreational, therapeutic, or sporting purposes. As used herein, a pool may be for human use (e.g., swimming, bathing) or may be particularly designed for use with wildlife (e.g., an aquarium for fish, other aquatic creatures, and/or aquatic plant life). Additionally, a pool may be man made or naturally occurring and may have a variety of shapes and sizes. Furthermore, a pool may be constructed above ground or below ground, and may have one or more discrete walls or floors, one or more rounded surfaces, or combinations of discrete walls, floors, and rounded surfaces. Accordingly, it should be appreciated that the term "pool" as used herein is intended to encompass various examples of water containing vessels such as, but not limited to, tubs, sinks, basins, baths, tanks, fish tanks, aquariums and the like.

Similarly, for purposes of the present disclosure, the term "spa" is used herein to describe a type of pool that is particularly designed for a variety of entertainment, recreational, therapeutic purposes and the like. Some other commonly used terms for a spa include, but are not limited to, "hot-tub," "whirlpool bath" and "Jacuzzi." Generally, a spa may include a number of accessory devices, such as one or more heaters, blowers, jets, circulation and filtration devices to condition water in the spa, as well as one or more light sources to illuminate the water in the spa. For purposes of the present disclosure, it also should be appreciated that a pool as described above may be divided up into one or more sections, and that one or more of the pool sections can be particularly adapted for use as a spa.

Having thus described several illustrative embodiments of the invention, various alterations, modifications, and improvements will readily occur to those skilled in the art. Such alterations, modifications, and improvements are intended to be within the spirit and scope of the invention. Accordingly, the foregoing description is by way of example only, and is not intended as limiting. The invention is limited only as defined in the following claims and the equivalents thereto.

What is claimed is:

1. An apparatus, comprising:
at least one light source adapted to be supported by one of a pool and a spa to illuminate a liquid contained in the one of the pool and the spa, the at least one light source being further adapted to generate a remotely controllable variable color radiation output to illuminate the liquid without requiring the use of a color filter,
wherein the at least one light source includes at least one input to receive at least one external signal, and wherein the at least one light source is adapted such that at least a color of the variable color radiation output is controlled based on the at least one external signal.

2. The apparatus of claim 1, in combination with the one of the pool and the spa.

3. The apparatus of claim 1, wherein the at least one light source is adapted to generate the remotely controllable variable color radiation output having at least one of a remotely controllable variable hue, a remotely controllable variable saturation, and a remotely controllable variable intensity.

4. The apparatus of claim 1, wherein the at least one light source includes means for engaging the at least one light source mechanically and electrically with a conventional light socket supported by the one of the pool and the spa.

5. The apparatus of claim 1, wherein the at least one light source includes at least one LED.

6. The apparatus of claim 5, wherein the at least one LED includes at least two differently colored LEDs.

7. The apparatus of claim 5, wherein the at least one LED includes at least one red LED, at least one green LED, and at least one blue LED.

8. The apparatus of claim 1,
wherein the at least one external signal is derived from a power source that supplies power to the apparatus, and wherein the at least one light source is adapted such that the variable color radiation output is controlled based on at least one interruption in the power supplied to the apparatus.

9. The apparatus of claim 1,
wherein the at least one external signal is derived from at least one sensor adapted to output at least one detection signal in response to at least one detectable condition, and wherein the at least one light source is adapted such that the variable color radiation output is controlled based on at least one detectable condition.

10. The apparatus of claim 1, wherein the at least one external signal is derived from at least one other device associated with the one of the pool and the spa, and wherein the at least one light source is adapted such that the variable color radiation output is controlled based on the at least one device.

11. The apparatus of claim 1,
wherein the at least one external signal is derived from at least one audio signal, and wherein the at least one light source is adapted such that the variable color radiation output is controlled based on the at least one audio signal.

12. The apparatus of claim 1,
wherein the at least one external signal is derived from a data network that provides at least one information signal intended for the at least one light source, and wherein the at least one light source is adapted such that the variable color radiation output is controlled based on the at least one information signal.

13. The apparatus of claim 12, further including the data network, wherein:
the data network is associated with a networked lighting system including a plurality of remotely controllable light sources; and
the at least one light source forms part of the networked lighting system.

14. The apparatus of claim 12, wherein:
the data network is coupled to at least one other device associated with the one of the pool and the spa; and
the at least one information signal is received from the at least one other device, such that the variable color radiation output is controlled by the at least one other device.

15. The apparatus of claim 12, wherein the data network includes the Internet, wherein the at least one information signal includes at least one Internet signal, and wherein the at least one light source is adapted such that the variable color radiation output is controlled based on the at least one Internet signal.

16. The apparatus of claim 15, wherein the at least one Internet signal relates to at least one weather condition, and wherein the at least one light source is adapted such that the variable color radiation output is controlled based on the at least one weather condition.

17. The apparatus of claim 1, further comprising at least one storage device, coupled to the at least one light source, to store at least one illumination program, wherein the apparatus is adapted to execute the at least one illumination program so as to control the remotely controllable variable color radiation output by the at least one light source based on the at least one external signal.

18. An apparatus, comprising:
at least one light source adapted to be supported by one of a pool and a spa to illuminate a liquid contained in the one of the pool and the spa, the at least one light source being further adapted to generate a remotely controllable variable color radiation output to illuminate the liquid without requiring the use of a color filter; and
at least one remote user interface, coupled to the at least one light source, to allow a user to remotely control at least a color of the variable color radiation output of the at least one light source.

19. The apparatus of claim 18, in combination with the one of the pool and the spa.

20. The apparatus of claim 18, wherein at least one of the at least one light source and the at least one remote user interface comprises at least one storage device to store at least one illumination program, wherein the at least one remote user interface is adapted to allow the user to cause the execution of the at least one illumination program so as to control the remotely controllable variable color radiation output by the at least one light source.

21. The apparatus of claim 20, wherein the at least one illumination program includes a plurality of illumination programs, wherein the at least one storage device stores the plurality of illumination programs, and wherein:
the at least one remote user interface is adapted to allow a user to select a particular illumination program of the plurality of illumination programs; and
the at least one remote user interface is adapted to cause the execution of the selected particular illumination program.

22. The apparatus of claim 20, wherein the at least one remote user interface includes the at least one storage device and further comprises at least one processor, coupled to the at least one storage device, to execute the at least one illumination program.

23. The apparatus of claim 18, wherein the at least one remote user interface further comprises at least one processor and at least one selector, coupled to the at least one processor, to allow the user to remotely control at least one parameter associated with the variable color radiation output of the at least one light source, wherein the at least one processor is responsive to operation of the at least one selector.

24. The apparatus of claim 23, wherein the at least one selector includes at least one button.

25. The apparatus of claim 23,
where in the at least one selector includes at least one of an adjustable dial, an adjustable slider, an adjustable thumb wheel and a joystick.

26. The apparatus of claim 23,
wherein the at least one selector includes at least one of a keypad and a touch-sensitive pad.

27. The apparatus of claim 23, wherein the at least one selector includes at least one switch.

28. The apparatus of claim 27,
wherein the at least one switch is configured to selectively provide power to the apparatus, and wherein the at least one light source is adapted such tat the variable color radiation output is controlled based on at least one interruption in the power supplied to the apparatus.

29. The apparatus of claim 23, wherein at least one of the at least one light source and the at least one remote user interface comprises at least one storage device to store at least one illumination program.

30. The apparatus of claim 29, wherein the at least one parameter includes at least one of an intensity of the variable color radiation, the color of the variable color radiation, and at least one property of the at least one illumination program, and wherein:
the at least one remote user interface is adapted such that the at least one selector allows the user to remotely control at least one of the intensity of the variable color radiation, the color of the variable color radiation, and the at least one property of the illumination program.

31. The apparatus of claim 30,
wherein the at least one property of the illumination program includes an execution speed of the illumination program, and wherein:
the at least one remote user interface is adapted such that the at least one selector allows the user to remotely control the execution speed of the illumination program.

32. The apparatus of claim 29, wherein the at least one illumination program includes a plurality of illumination programs, wherein the at least one storage device stores the plurality of illumination programs, and wherein:
the at least one remote user interface is adapted such that the at least one selector allows the user to remotely select a particular illumination program of the plurality of illumination programs.

33. The apparatus of claim 23, wherein the at least one remote user interface includes at least one display screen, coupled to the processor, to indicate to the user a status of at least one parameter associated with the variable color radiation output of the at least one light source.

34. The apparatus of claim 18,
wherein the at least one remote user interface further includes at least one communication port to output at least one control signal, and wherein the apparatus further comprises:
at least one controller, coupled to the at least one light source and to the at least one communication port, to receive the at least one control signal from the at least one remote user interface and to control the variable color radiation output based on the at least one control signal.

35. The apparatus of claim 34, wherein the at least one communication port is adapted to support transport of the at least one control signal to the at least one controller via at least one of a wire link and a fiber optic.

36. The apparatus of claim 34, wherein the at least one communication port is adapted to support transport of the at least one control signal to the at least one controller via a wireless link.

37. The apparatus of claim 34, further comprising:
at least one storage device, coupled to at least one of the at least one remote user interface and the at least one controller, to store at least one illumination program, wherein the at least one controller is adapted to execute the at least one illumination program, based on the at least one control signal output by the at least one remote user interface, so as to control the radiation output by the at least one light source.

38. The apparatus of claim 37, wherein the at least one illumination program includes a plurality of illumination programs, wherein the at least one storage device stores the plurality of illumination programs, and wherein:
the at least one remote user interface is adapted to allow a user to remotely select a particular illumination program of the plurality of illumination programs and to output the at least one control signal so as to indicate the selected particular illumination program; and
the at least one controller is adapted to execute the selected particular illumination program based on the at least one control signal.

39. A method of illuminating a liquid, comprising acts of:
a) illuminating the liquid with variable color radiation that is generated without requiring the use of a color filter; and
b) remotely controlling at least a color of the variable color radiation,
wherein the act b) comprises an act of:
remotely controlling the variable color radiation based on at least one interruption in power supplied to at least one light source that generates the variable color radiation.

40. The method of claim 39, wherein the liquid is contained in one of a pool and a spa, and wherein the act a) comprises an act of:
illuminating the liquid in the one of the pool and the spa with the variable color radiation.

41. The method of claim 39, wherein the act b) comprises an act of:
remotely varying at least one of an intensity and the color of the variable color radiation.

42. A method of illuminating a liquid, comprising acts of:
a) illuminating the liquid with variable color radiation that is generated without requiring the use of a color filter; and
b) remotely controlling at least a color of the variable color radiation,
wherein the act b) comprises an act of:
remotely controlling the variable color radiation based on at least one detectable condition.

43. The method of claim 42, wherein the liquid is contained in a fountain, and wherein the act a) comprises an act of:
illuminating the liquid in the fountain with the variable color radiation.

44. A method of illuminating a liquid, comprising acts of:
a) illuminating the liquid with variable color radiation that is generated without requiring the use of a color filter; and
b) remotely controlling at least a color of the variable color radiation,
wherein the act b) comprises an act of:
remotely controlling the variable color radiation based on at least one audio signal.

45. A method of illuminating a liquid, comprising acts of:
a) illuminating the liquid with variable color radiation that is generated without requiring the use of a color filter; and
b) remotely controlling at least a color of the variable color radiation, wherein the act b) comprises an act of:
 b1) remotely controlling the variable color radiation based on information obtained from a data network.
46. The method of claim 45, wherein the act b1) comprises an act of:
 remotely controlling the variable color radiation based on information obtained from at least one other device coupled to the data network.
47. The method of claim 45, wherein the act b1) comprises an act of:
 b2) remotely controlling the variable color radiation based on information obtained from the Internet.
48. The method of claim 47, wherein the information received from the Internet relates to at least one weather condition, and wherein the act b2) includes an act of:
 remotely controlling the variable color radiation based on the at least one weather condition.
49. A method of illuminating a liquid, comprising acts of:
 a) illuminating the liquid with variable color radiation that is generated without requiring the use of a color filter; and
 b) remotely controlling at least a color of the variable color radiation,
 wherein the act b) comprises an act of:
 b3) remotely initiating execution of at least one illumination program so as to control the variable color radiation.
50. The method of claim 49, wherein the at least one illumination program includes a plurality of illumination programs, and wherein the act b3) comprises acts of:
 remotely selecting a particular illumination program of the plurality of illumination programs; and
 executing the selected particular illumination program so as to control the variable color radiation.
51. The method of claim 49, wherein at least one parameter is associated with the at least one illumination program, and wherein the act b) further comprises an act of:
 b4) remotely adjusting the at least one parameter associated with the at least one illumination program.
52. A method of illuminating a liquid, comprising acts of:
 illuminating the liquid with variable color radiation that is generated without requiring the use of a color filter;
 remotely controlling at least a color of the variable color radiation; and
 indicating to a user a status of at least one parameter associated with the remotely controllable variable color radiation.
53. An apparatus, comprising:
 at least one remote user interface to remotely control at least one light source adapted to be supported by one of a pool and a spa, the at least one light source further adapted to generate variable color radiation to illuminate a liquid contained in the one of the pool and the spa, the at least one remote user interface comprising:
 at least two selectors to allow a user to remotely control at least one parameter associated with the variable color radiation generated by the at least one light source.
54. The apparatus of claim 53, in combination with the at least one light source.
55. The combination of claim 54, in combination with the one of the pool and the spa.
56. The apparatus of claim 53, wherein at least one selector of the at least two selectors includes at least one button.
57. The apparatus of claim 53,
 wherein at least one selector of the at least two selectors includes at least one of an adjustable dial, an adjustable slider, an adjustable thumb wheel and a joystick.
58. The apparatus of claim 53,
 wherein at least one selector of the at least two selectors includes at least one of a keypad and a touch-sensitive pad.
59. The apparatus of claim 53, wherein at least one selector of the at least two selectors includes at least one switch.
60. The apparatus of claim 53, wherein the at least one parameter includes at least one of an intensity of the variable radiation output of the at least one light source and a color of the variable radiation output of the at least one light source, and wherein the at least one remote user interface is adapted such that at least one selector of the at least two selectors allows the user to remotely control at least one of the intensity and the color of the variable radiation output of the at least one light source.
61. The apparatus of claim 53, wherein the at least one remote user interface includes at least one processor, responsive to the at least two selectors, to control the variable radiation output of the at least one light source.
62. The apparatus of claim 61, wherein at least one of the at least one light source and the at least one remote user interface includes at least one storage device to store at least one illumination program, wherein the at least one remote user interface is adapted to cause the execution of the at least one illumination program, in response to at least one selector of the at least two selectors, so as to control the variable color radiation output by the at least one light source.
63. The apparatus of claim 62, wherein the at least one remote user interface includes the at least one storage device, and wherein the at least one storage device is coupled to the at least one processor.
64. The apparatus of claim 62, wherein the at least one parameter includes at least one of an intensity of the variable radiation output, a color of the variable radiation output, and at least one property of the illumination program, and wherein:
 the at least one remote user interface is adapted such that at least one selector of the at least two selectors allows the user to control at least one of the intensity of the variable radiation output, the color of the variable radiation output, and the at least one property of the illumination program.
65. The apparatus of claim 64,
 wherein the at least one property of the illumination program includes an execution speed of the illumination program, and wherein:
 the at least one remote user interface is adapted such that the at least one selector allows the user to control the execution speed of the illumination program.
66. The apparatus of claim 62, wherein the at least one illumination program includes a plurality of illumination programs, wherein the at least one storage device stores the plurality of illumination programs, and wherein:
 the at least one remote user interface is adapted such that at least one selector of the at least two selectors allows the user to select a particular illumination program of the plurality of illumination programs.
67. The apparatus of claim 66, wherein:
 a first selector of the at least two selectors allows the user to select the particular illumination program of the plurality of illumination programs; and a second selector of the at least two selectors allows the user to control at least one property of the selected particular illumination program.

68. The apparatus of claim 61, wherein the at least one remote user interface includes at least one display screen, coupled to the at least one processor, to indicate to the user a status of at least one parameter associated with the variable radiation output of the at least one light source.

69. An apparatus of claim 61, wherein the at least one remote user interface further includes at least one communication port to output at least one control signal to the at least one light source, and wherein the at least one communication port is adapted to support transport of the at least one control signal to the at least one light source via at least one of a wire link and a fiber optic.

70. An apparatus of claim 61, wherein the at least one remote user interface further includes at least one communication port to output at least one control signal to the at least one light source, and wherein the at least one communication port is adapted to support transport of the at least one control signal to the at least one light source via a wireless link.

71. An apparatus, comprising:

at least one light source adapted to be supported by a fountain to illuminate a liquid in the fountain, the at least one light source being further adapted to generate a remotely controllable variable color radiation output to illuminate the liquid without requiring the use of a color filter, wherein the at least one light source includes at least one input to receive at least one external signal, and wherein the at least one light source is adapted such that at least a color of the variable color radiation output is controlled based on the at least one external signal, and wherein the at least one external signal is derived from at least one sensor adapted to output at least one detection signal in response to at least one detectable condition, and wherein the at least one light source is adapted such that the variable color radiation output is controlled based on at least one detectable condition.

* * * * *

UNITED STATES PATENT AND TRADEMARK OFFICE
CERTIFICATE OF CORRECTION

PATENT NO.       : 6,936,978 B2                                                                 Page 1 of 1
APPLICATION NO.  : 10/040291
DATED            : August 30, 2005
INVENTOR(S)      : Morgan et al.

It is certified that error appears in the above-identified patent and that said Letters Patent is hereby corrected as shown below:

On Title Page col. Item 63 should read,
    Related U.S. Application Data (63)

Continuation-in-part of application No. 09/870,418, filed on May 30, 2001, and a continuation-in-part of application No. 09/870,193, filed on May 30, 2001, now Pat. No. 6,608,453, and a continuation-in-part of application No. 09/815,418, filed on Mar. 22, 2001, which is a continuation of application No. 09/213,548 filed Dec. 17, 1998, now Pat. No. 6,166,496, and a continuation-in-part of application No. 09/805,368, filed on Mar. 13, 2001, and a continuation-in-part of application No. 09/805,590, filed on Mar. 13, 2001, and a continuation-in-part of application No. 09/742,017, filed on Dec. 20, 2000, now abandoned, and a continuation-in-part of application No. 09/669,121, filed on Sep. 25, 2000, now Pat. No. 6,806,659, which is a continuation of application No. 09/425,770, filed on Oct. 22, 1999, now Pat. No. 6,150,774, which is a continuation of application No. 08/920,156, filed on Aug. 26, 1997, now Pat. No. 6,016,038, and a continuation-in-part of application No. 09/616,214, filed on Jul. 14, 2000, and a continuation-in-part of application No. 09/344,699, filed on Jun. 25, 1999, and a continuation-in-part of application No. 09/333,739, filed on Jun. 15, 1999, and a continuation-in-part of application No. 09/215,624, filed on Dec. 17, 1998, now Pat. No. 6,528,954, and a continuation-in-part of application No. 09/213,607, filed Dec. 17, 1998, and a continuation-in-part of application No. 09/213,189 filed Dec. 17, 1998, and a continuation-in-part of application No. 09/213,581 filed on Dec. 17, 1998, and a continuation-in-part of application No. 09/213,540, filed on Dec. 17, 1998, now Pat. No. 6,720,745.

Signed and Sealed this

Fifth Day of September, 2006

JON W. DUDAS
*Director of the United States Patent and Trademark Office*